(12) United States Patent
Yamada et al.

(10) Patent No.: US 11,758,826 B2
(45) Date of Patent: Sep. 12, 2023

(54) INTEGRATED DEVICE AND NEUROMORPHIC DEVICE

(71) Applicant: TDK CORPORATION, Tokyo (JP)

(72) Inventors: Shogo Yamada, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 211 days.

(21) Appl. No.: 17/491,028

(22) Filed: Sep. 30, 2021

(65) Prior Publication Data

US 2022/0109101 A1    Apr. 7, 2022

(30) Foreign Application Priority Data

Oct. 2, 2020 (JP) ................. 2020-167811

(51) Int. Cl.
    *G11C 11/16*      (2006.01)
    *H10N 52/80*      (2023.01)
    (Continued)

(52) U.S. Cl.
CPC ........... *H10N 52/80* (2023.02); *G06F 7/5443* (2013.01); *G06N 3/065* (2023.01); *G11C 11/161* (2013.01); *G11C 11/1675* (2013.01); *H01F 10/3254* (2013.01); *H10B 61/22* (2023.02); *H10N 52/00* (2023.02); *H10N 52/01* (2023.02)

(58) Field of Classification Search
None
See application file for complete search history.

(56) References Cited

U.S. PATENT DOCUMENTS

2011/0129691 A1    6/2011   Ishiwata et al.
2020/0258559 A1*   8/2020   Ashida ................ G11C 11/5607
(Continued)

FOREIGN PATENT DOCUMENTS

JP     2002-359355 A    12/2002
JP     2005-150303 A     6/2005
(Continued)

OTHER PUBLICATIONS

Koyama et al., "Observation of the intrinsic pinning of a magnetic domain wall in a ferromagnetic nanowire," Nature Materials, Mar. 2011, vol. 10, pp. 194-197.

*Primary Examiner* — Tan T. Nguyen
(74) *Attorney, Agent, or Firm* — Oliff PLC

(57) ABSTRACT

According to an embodiment, there is provided an integrated device including: a substrate; and a laminated structure stacked on the substrate, in which the laminated structure includes a first element group and a second element group disposed at a position farther from the substrate than the first element group, each of the first element group and the second element group includes a plurality of domain wall movement elements, each of the plurality of domain wall movement elements includes a domain wall movement layer, a ferromagnetic layer, and a non-magnetic layer interposed between the domain wall movement layer and the ferromagnetic layer, and each of the domain wall movement elements belonging to the second element group has a lower critical current density required for moving a domain wall of the domain wall movement layer than each of the domain wall movement elements belonging to the first element group.

20 Claims, 18 Drawing Sheets

(51) Int. Cl.
  *G06F 7/544*   (2006.01)
  *H01F 10/32*   (2006.01)
  *G06N 3/065*   (2023.01)
  *H10B 61/00*   (2023.01)
  *H10N 52/00*   (2023.01)
  *H10N 52/01*   (2023.01)

(56)  References Cited

U.S. PATENT DOCUMENTS

2020/0273511 A1\*  8/2020  Ashida ................ G11C 11/1673
2020/0334015 A1    10/2020  Shibata et al.
2021/0110857 A1     4/2021  Endoh et al.
2021/0376229 A1\* 12/2021  Ashida .................. G11C 11/161
2022/0005866 A1\*  1/2022  Yamada ................. G06N 3/065

FOREIGN PATENT DOCUMENTS

| JP | 2007-258460 A | 10/2007 |
| JP | 5441005 B2 | 3/2014 |
| WO | 2016/159017 A1 | 10/2016 |
| WO | 2019/176540 A1 | 9/2019 |
| WO | 2019/188252 A1 | 10/2019 |

\* cited by examiner

INTEGRATED DEVICE AND NEUROMORPHIC DEVICE

CROSS-REFERENCE TO RELATED APPLICATION

This application is based upon and claims the benefit of priority from Japanese Patent Application No. 2020-167811, Oct. 2, 2020; the entire contents of which are incorporated herein by reference.

BACKGROUND

The present invention relates to an integrated device and a neuromorphic device.

Magnetoresistance effect elements using changes in a resistance value (magnetoresistance changes) based on changes in a relative angle between magnetizations of two ferromagnetic layers are known. Among magnetoresistance effect elements, there are magnetoresistance effect elements in which a current path used when data is written and a current path used when data is read are different from each other. In such magnetoresistance effect elements, in order to control the currents of different current paths, three switching elements are connected. A magnetoresistance effect element controlled by three switching elements is called a three-terminal magnetoresistance effect element.

For example, a magnetoresistance effect element of a domain wall movement type disclosed in Patent Document 1 is an example of a three-terminal magnetoresistance effect element.

PATENT DOCUMENTS

[Patent Document 1] Japanese Patent No. 5441005

SUMMARY

Magnetoresistance effect elements are frequently integrated and used. When there are deviations between performances of integrated magnetoresistance effect elements, the controllability of the entire integrated device is reduced.

The present invention is in view of the problems described above, and an object thereof is to provide an integrated device and a neuromorphic device having a small performance deviation between magnetoresistance effect elements and having superior controllability as a whole.

(1) According to a first embodiment, an integrated device is provided including: a substrate; and a laminated structure stacked on the substrate, in which the laminated structure includes a first element group and a second element group disposed at a position farther from the substrate than the first element group, each of the first element group and the second element group includes a plurality of domain wall movement elements, each of the plurality of domain wall movement elements includes a domain wall movement layer, a ferromagnetic layer, and a non-magnetic layer interposed between the domain wall movement layer and the ferromagnetic layer, and each of the domain wall movement elements belonging to the second element group has a lower critical current density required for moving a domain wall of the domain wall movement layer than each of the domain wall movement elements belonging to the first element group.

(2) According to a second embodiment, an integrated device is provided including: a substrate; and a laminated structure stacked on the substrate, in which the laminated structure includes a first element group and a second element group disposed at a position farther from the substrate than the first element group, each of the first element group and the second element group includes a plurality of domain wall movement elements, each of the plurality of domain wall movement elements includes a domain wall movement layer, a ferromagnetic layer, and a non-magnetic layer interposed between the domain wall movement layer and the ferromagnetic layer, and each of the domain wall movement elements belonging to the second element group has a higher domain wall moving speed of the domain wall movement layer than each of the domain wall movement elements belonging to the first element group.

(3) In the integrated device according to the aspect described above, materials composing the domain wall movement layers of the domain wall movement element belonging to the first element group and the domain wall movement element belonging to the second element group may be different from each other.

(4) In the integrated device according to the aspect described above, widths of the domain wall movement layers of the domain wall movement element belonging to the first element group and the domain wall movement element belonging to the second element group may be different from each other.

(5) In the integrated device according to the aspect described above, a saturation magnetization of the domain wall movement layer of the domain wall movement element belonging to the second element group may be lower than a saturation magnetization of the domain wall movement layer of the domain wall movement element belonging to the first element group.

(6) In the integrated device according to the aspect described above, an electrical resistivity of the domain wall movement layer of the domain wall movement element belonging to the second element group may be lower than an electrical resistivity of the domain wall movement layer of the domain wall movement element belonging to the first element group.

(7) In the integrated device according to the aspect described above, the thickness of the domain wall movement layer of the domain wall movement element belonging to the second element group may be smaller than the thickness of the domain wall movement layer of the domain wall movement element belonging to the first element group.

(8) In the integrated device according to the aspect described above, each of the domain wall movement elements belonging to the second element group may have a larger inclination angle of a side face of the domain wall movement layer with respect to a stacking direction in a cross-section orthogonal to a first direction in which the domain wall movement layer extends than each of the domain wall movement elements belonging to the first element group.

(9) In the integrated device according to the aspect described above, the domain wall movement layer of the domain wall movement element belonging to the second element group may include a first layer and a second layer containing a ferromagnetic substance and a spacer layer interposed between the first layer and the second layer.

(10) In the integrated device according to the aspect described above, the domain wall movement element belonging to the second element group may further include a wiring line layer that is disposed at a position at which the domain wall movement layer is interposed between the wiring line layer and the non-magnetic layer and applies a spin orbital torque to a magnetization of the domain wall movement layer.

(11) In the integrated device according to the aspect described above, the domain wall movement element belonging to the first element group may further include a wiring line layer that is disposed at a position having the domain wall movement layer interposed between the wiring line layer and the non-magnetic layer and applies a spin orbital torque to the magnetization of the domain wall movement layer, and the wiring line layer of the second element group may have a larger spin Hall angle than the wiring line layer of the first element group.

(12) In the integrated device according to the aspect described above, any one of the domain wall movement elements belonging to the second element group may overlap one of the domain wall movement elements belonging to the first element group when seen in a stacking direction.

(13) In the integrated device according to the aspect described above, all the domain wall movement elements belonging to the second element group may be configured not to overlap the domain wall movement elements belonging to the first element group when seen in a stacking direction.

(14) In the integrated device according to the aspect described above, the laminated structure may further include a connection wiring line connecting one domain wall movement element belonging to the first element group to one domain wall movement element belonging to the second element group.

(15) In the integrated device according to the aspect described above, the first element group may perform a first product-sum operation, and the second element group may perform a second product-sum operation, and the sum of outputs from a plurality of domain wall movement elements belonging to the first element group may be input to the domain wall movement elements belonging to the second element group.

(16) In the integrated device according to the aspect described above, the pulse length of a write pulse input to the domain wall movement element belonging to the second element group may be longer than the pulse length of a write pulse input to the domain wall movement element belonging to the first element group.

(17) In the integrated device according to the aspect described above, the pulse amplitude of a write pulse input to the domain wall movement element belonging to the second element group may be larger than a pulse amplitude of a write pulse input to the domain wall movement element belonging to the first element group.

(18) According to a third aspect, a neuromorphic device includes the integrated device according to the aspect described above.

(19) In the neuromorphic device according to the aspect described above, a plurality of layers responsible for a neural network may be further included, and the domain wall movement elements belonging to the first element group and the domain wall movement elements belonging to the second element group may be responsible for operations between different layers.

(20) In the neuromorphic device according to the aspect described above, a plurality of layers responsible for a neural network may be further included, and some of the domain wall movement elements belonging to the first element group and some of the domain wall movement elements belonging to the second element group may be responsible for operations between the layers.

According to an integrated device and a neuromorphic device of the aspects described above, performance deviations of magnetoresistance effect elements are small, and the controllability is superior as a whole.

DETAILED DESCRIPTION

Figure 1:
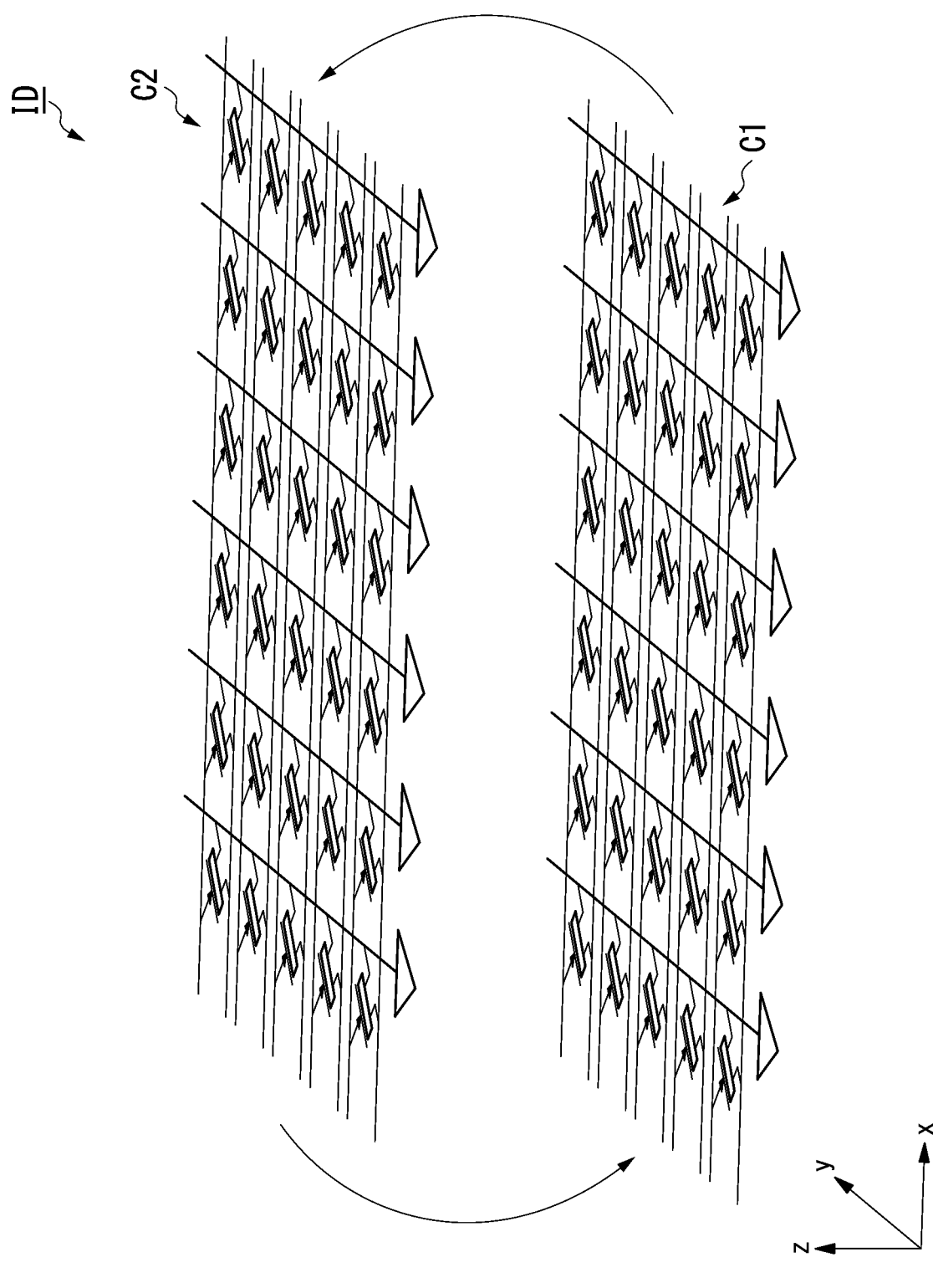
FIG. 1 is a circuit diagram of an integrated device according to a first embodiment.

Hereinafter, embodiments will be described in detail with appropriate reference to the drawings. In the drawings used in description presented below, parts that are features may be illustrated by being enlarged for easy understanding of the features, and dimension ratios and the like of constituent elements may be different from actual values. Materials, dimensions, and the like illustrated in description presented below are examples, and the present invention is not limited thereto, and they may be appropriately changed in a range in which effects of the present invention are acquired.

First directions will be defined. One direction of one face of a substrate Sb (see FIG. 4) is set as an x direction, and a direction that is orthogonal to the x direction is set as a y direction. For example, the x direction is a direction in which a domain wall movement layer of a domain wall movement element extends. The x direction is an example of a first direction. A z direction is a direction that is orthogonal to the x direction and the y direction. The z direction is an example of a stacking direction. Hereinafter, a +z direction may be represented as "up", and a −z direction may be represented as "down". The +z direction is a direction separating away from the substrate Sb. Up and down may not necessarily coincide with the direction in which the force of gravity is applied.

In this description, "extending in a first direction" means that a length in a first direction is longer than lengths in the other directions. In addition, in this description, "connection" is not limited to a direct connection and includes connection with a layer interposed therebetween.

First Embodiment

FIG. 1 is a circuit diagram of an integrated device ID according to a first embodiment. For example, the integrated device ID includes a first circuit C1 and a second circuit C2. The first circuit C1 and the second circuit C2 are product-sum operation circuits that perform different product-sum operations. The first circuit C1 and the second circuit C2 are connected to each other. For example, an output of the first circuit C1 that is acquired through a product-sum operation is input to the second circuit C2. For example, the second circuit C2 performs an additional product-sum operation using a result of the product-sum operation performed by the first circuit C1 as an input.

For example, the integrated device ID according to the first embodiment functions as a neuromorphic device. The neuromorphic device is a device that performs an operation of a neural network. The neuromorphic device artificially imitates a relation between neurons and synapses in the brain of a human.

Figure 2:
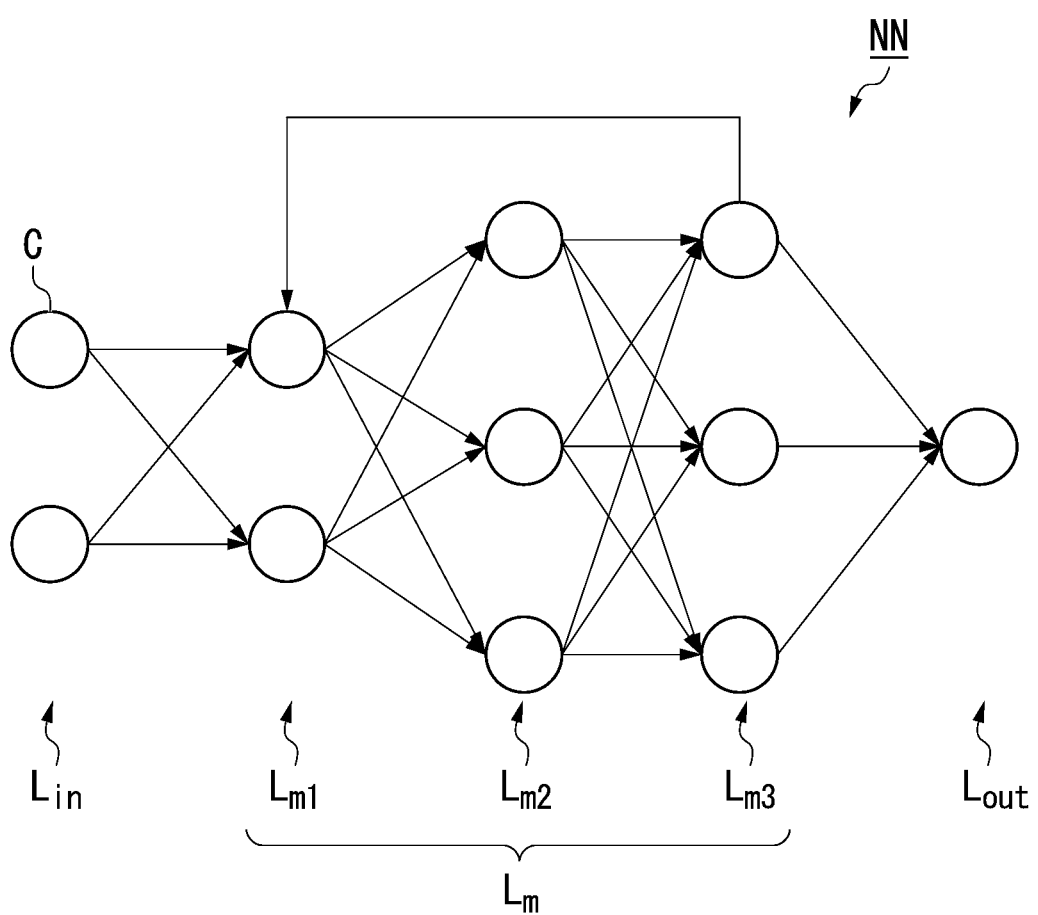
FIG. 2 is a schematic diagram of a neural network.

FIG. 2 is a schematic diagram of a neural network NN. The neural network NN has an input layer $L_{in}$, middle layers $L_m$, and an output layer $L_{out}$. Although an example in which the number of middle layers $L_m$ is three layers is presented in FIG. 2, the number of middle layers $L_m$ is arbitrary. Each of the input layer $L_{in}$, the middle layers $L_m$, and the output layer $L_{out}$ includes a plurality of chips C, and each of the chips C corresponds to a neuron in the brain. The input layer $L_{in}$, the middle layers $L_m$, and the output layer $L_{out}$ are connected using transmission means. A transmission means corresponds to a synapse in the brain. As the transmission means (synapses) performs learning, the neural network NN increases the correct answer rate for a problem. The learning is to find knowledge that can be used in the future from information. The neural network NN performs learning by being operated with weighting factors applied to the transmission means being changed. The transmission means performs product operations of applying weighting factors to an input signal and the sum operation of summing results of product operations. In other words, the transmission means performs a product-sum operation.

The first circuit C1 illustrated in FIG. 1 is, for example, responsible for a product-sum operation from the first middle layer $L_{m1}$ to the second middle layer $L_{m2}$, and the second circuit C2 is, for example, responsible for a product-sum operation from the second middle layer $L_{m2}$ to the third middle layer $L_{m3}$.

Figure 3:
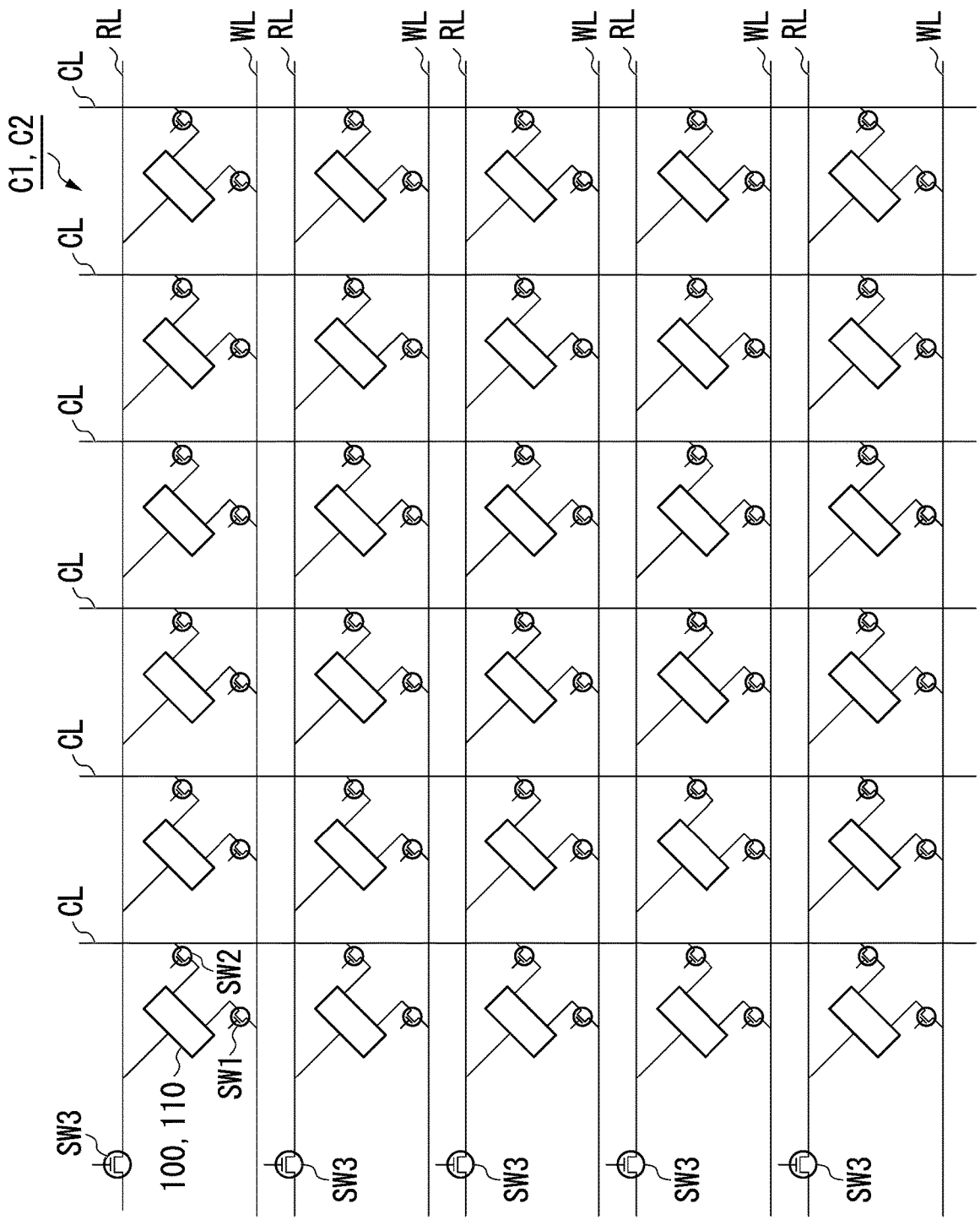
FIG. 3 is a circuit diagram of part of the integrated device according to the first embodiment.

FIG. 3 is a circuit diagram of part of the integrated device ID according to the first embodiment. FIG. 3 is a circuit diagram of the first circuit C1 or the second circuit C2. For example, the first circuit C1 and the second circuit C2 have the same circuit structure.

The first circuit C1 includes a plurality of domain wall movement elements 100. The second circuit C2 includes a plurality of domain wall movement elements 110. Each of the first circuit C1 and the second circuit C2 includes a plurality of first switching elements SW1, a plurality of second switching elements SW2, a plurality of third switching elements SW3, a plurality of write lines WL, a plurality of read lines RL, and a plurality of common lines CL.

In the first circuit C1, the domain wall movement elements 100 are arranged, for example, in a matrix pattern. In the second circuit C2, the domain wall movement elements 110 are arranged, for example, in a matrix pattern. One domain wall movement element 100 or 110 is connected to one first switching element SW1, one second switching element SW2, and one third switching element SW3. Any one of the first switching element SW1, the second switching element SW2, and the third switching element SW3 may be connected to a plurality of domain wall movement elements 100 or 110.

When the first switching element SW1 and the second switching element SW2 connected to a specific domain wall movement element 100 or 110 are turned on, data is written into the specific domain wall movement element 100 or 110. Data is recorded as a resistance value of the domain wall movement element 100 or 110 in a stacking direction. In addition, when the second switching element SW2 and the third switching element SW3 connected to a specific domain wall movement element 100 or 110 are turned on, data written in the specific domain wall movement element 100 or 110 is read.

In a case in which data is read from the domain wall movement element 100 or 110, a current is caused to flow from the read line RL to the common line CL. A current (output value) output from the common line CL differs in accordance with a resistance value (a weighting factor) of the domain wall movement element 100 or 110. In other words, applying a current from the read line RL to the common line CL corresponds to a product operation in the neural network NN. In addition, the common line CL is connected to a plurality of the domain wall movement elements 100 or 110 belonging to the same column, and a current detected at an end of the common line CL has a value that is acquired by performing a sum operation of results of product operations performed by the domain wall movement elements 100 or 110. Thus, the integrated device ID functions as a product-sum operator of the neural network NN.

Currents applied to the read lines RL of the integrated device ID are inputs to a product-sum operator, and currents output from the common lines CL of the integrated device ID are outputs from the product-sum operator. An input signal input to the product-sum operator may be controlled using a pulse width, a pulse height, or a pulse frequency.

For example, each of the first switching elements SW1, the second switching elements SW2, and the third switching elements SW3 may be a field effect transistor. For example, each of the first switching elements SW1, the second switching elements SW2, and the third switching elements SW3 may be an element using a phase change of a crystal layer such as an ovonic threshold switch (OTS), an element using a change in a band structure such as a metal insulator transition (MIT) switch, an element using a breakdown voltage such as a Zener diode or an avalanche diode, or an element of which conductivity changes in accordance with a change in an atom position.

The first switching element SW1 is connected to the write line WL. The second switching element SW2 is connected to the common line CL. The third switching element SW3 is connected to the read line RL. The read line RL is a wiring line through which a current flows when data is read. The write line WL is a wiring line through which a current flows when data is written. The common line CL is a wiring line through which a current flows in any of a case in which data is written and a case in which data is read.

Figure 4:
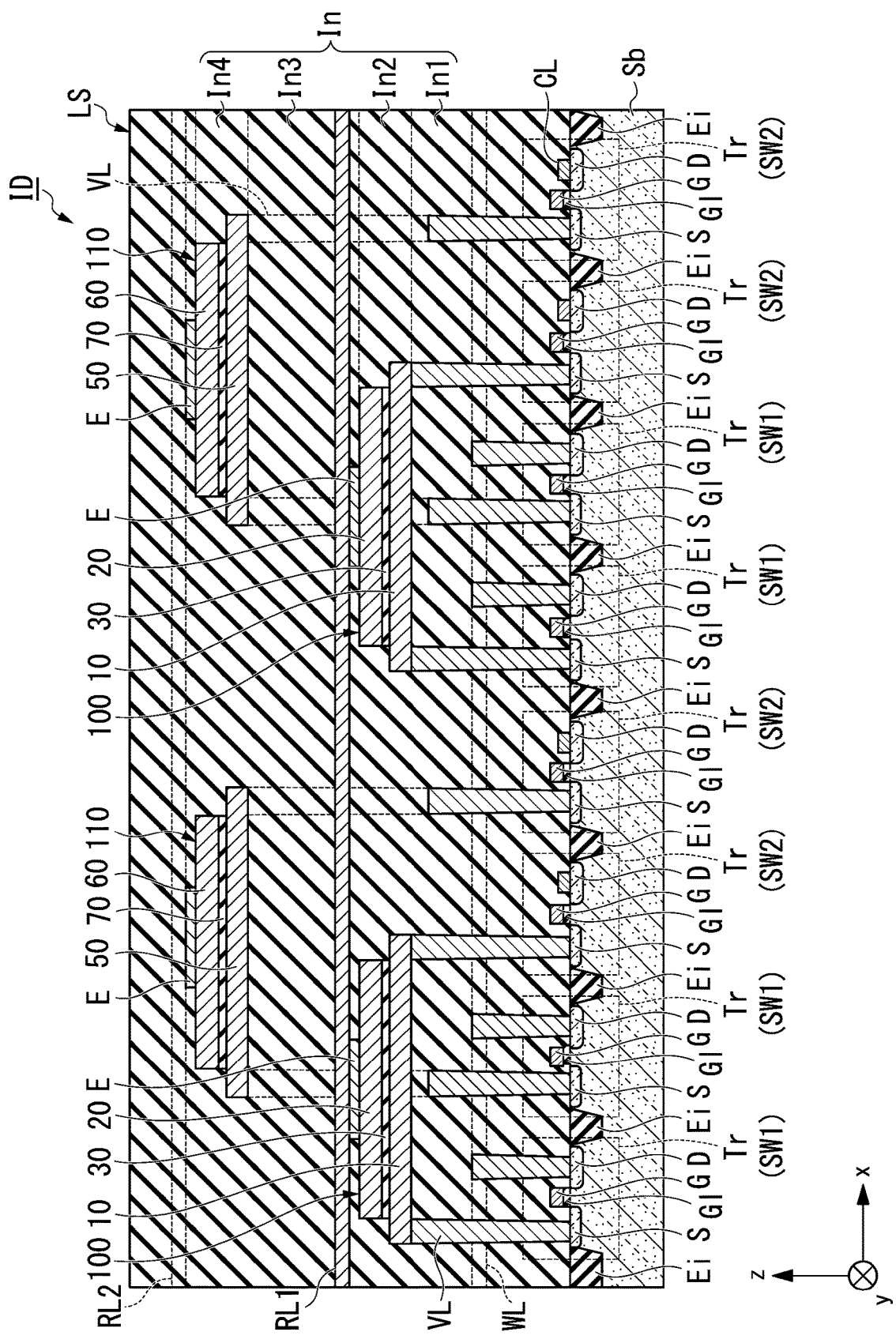
FIG. 4 is a cross-sectional view of a feature part of the integrated device according to the first embodiment.
Figure 5:
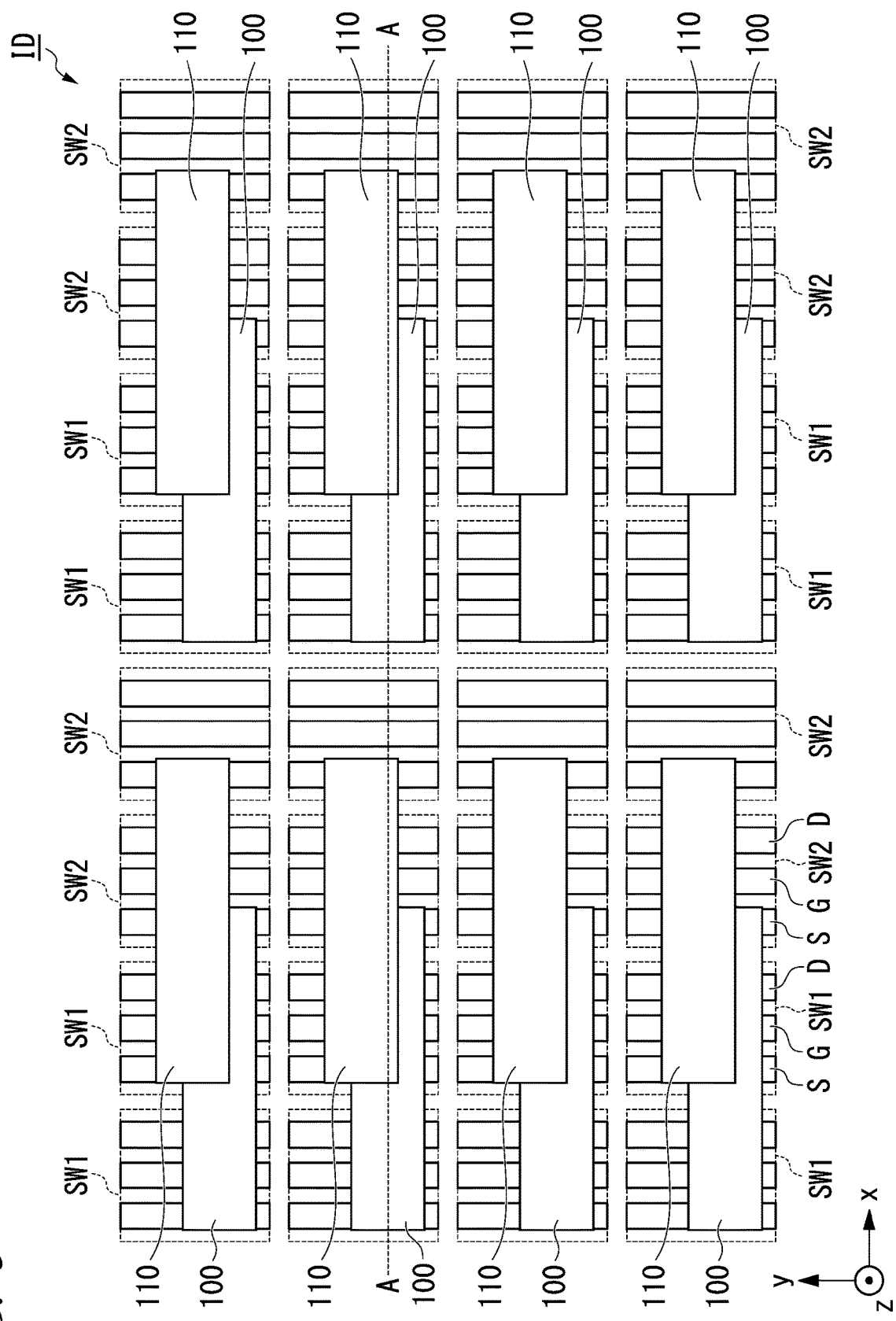
FIG. 5 is a plan view of a feature part of the integrated device according to the first embodiment.
Figure 6:
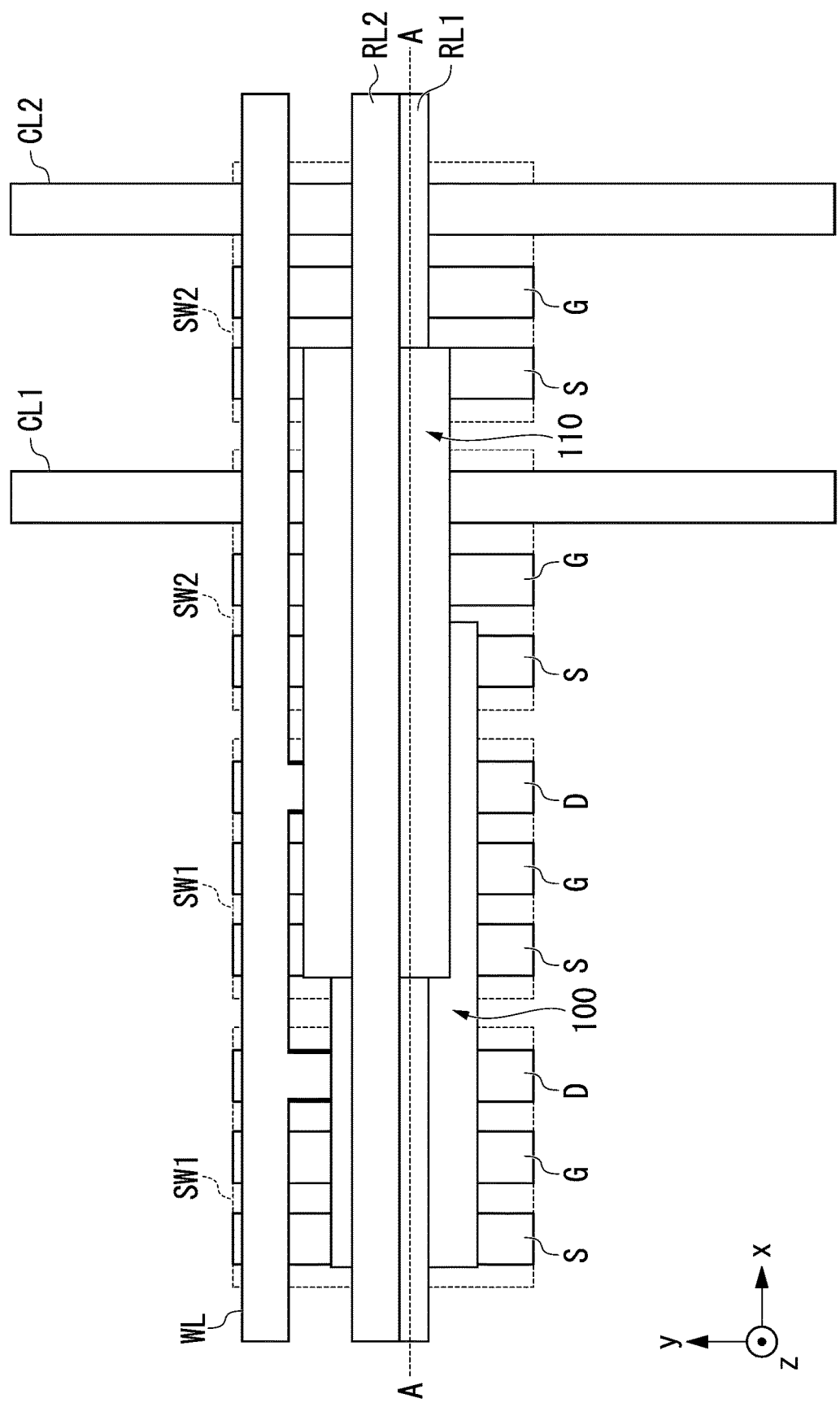
FIG. 6 is a plan view in which the vicinity of two domain wall movement elements of the integrated device according to the first embodiment is enlarged.
Figure 7:
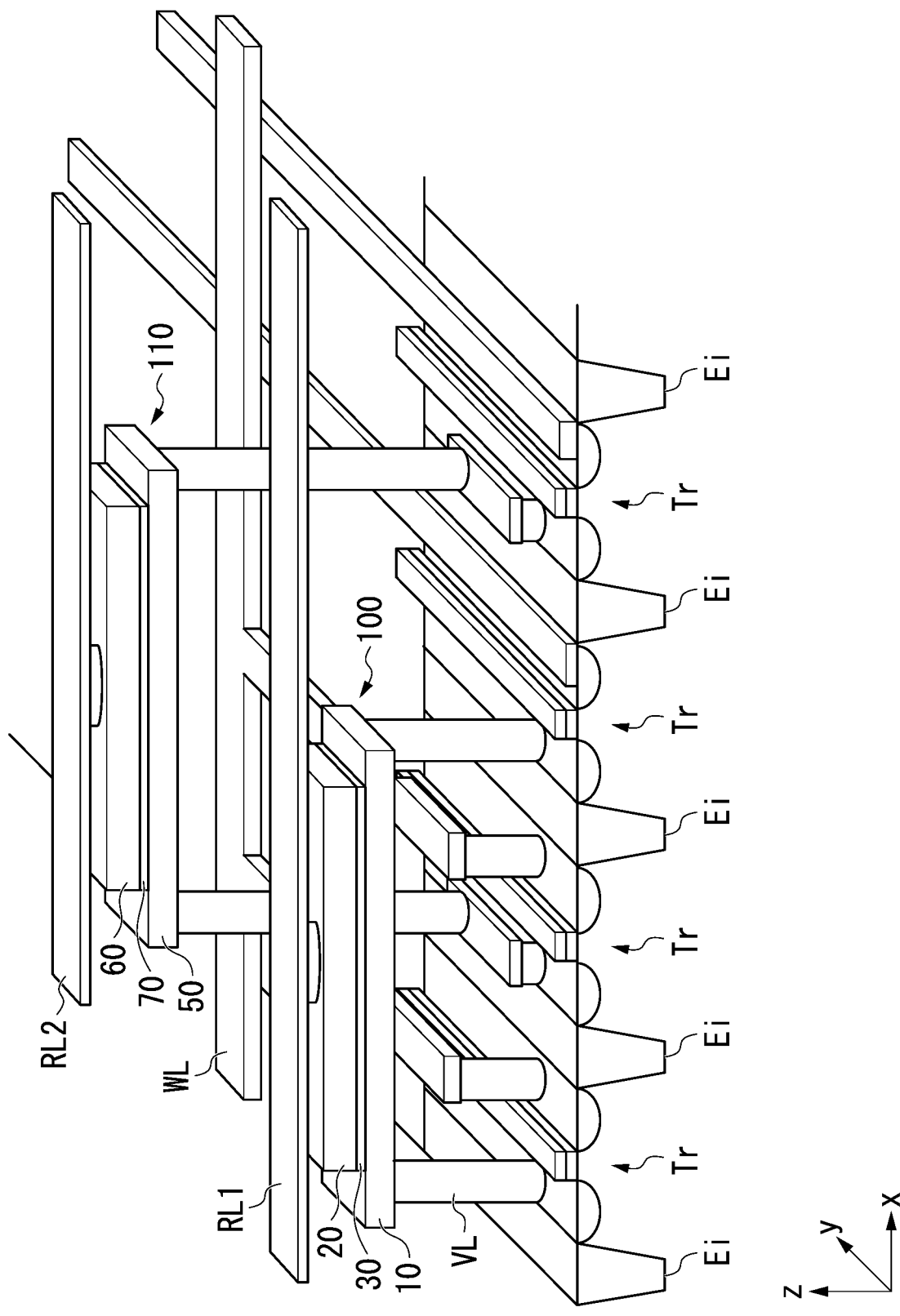
FIG. 7 is a perspective view of a feature part of the integrated device according to the first embodiment.

FIG. 4 is a cross-sectional view of a feature part of the integrated device ID according to the first embodiment. FIG. 5 is a plan view of a feature part of the integrated device ID according to the first embodiment. FIG. 5 is illustrated with the read lines RL, the write lines WL, and the common lines CL excluded. FIG. 6 is a plan view in which the vicinity of two domain wall movement elements 100 and 110 of the integrated device ID according to the first embodiment is enlarged. FIG. 4 illustrates a cross-section xz taken along line A-A in FIGS. 5 and 6. FIG. 7 is a perspective view of a feature part of the integrated device ID. FIG. 7 is illustrated with insulators In excluded.

The integrated device ID includes a substrate Sb and a laminated structure LS. The laminated structure LS is disposed on the substrate Sb.

For example, the substrate Sb is a semiconductor substrate. The substrate Sb includes a plurality of switching elements. The plurality of switching elements are insulated from each other by inter-element insulators Ei. The plurality of switching elements control the domain wall movement elements 100 and 110.

For example, the plurality of switching elements are first switching elements SW1 and second switching elements SW2. For example, third switching elements SW3 are disposed at different positions in the y direction. For example, the third switching elements SW3 are disposed in a peripheral area outside an integration region in which the domain wall movement elements 100 and 110 are integrated. Hereinafter, a case in which the first switching elements SW1 and the second switching elements SW2 are arranged in a matrix pattern inside the integration region will be described as an example.

For example, each of the first switching elements SW1 and the second switching elements SW2 is a field effect transistor Tr. Hereinafter, the first switching element SW1 and the second switching element SW2 may be simply referred to as transistors Tr without being distinguished from each other.

For example, the transistors Tr are arranged in a matrix pattern. For example, the transistor Tr has a gate G, a gate insulating film GI, a source S, and a drain D. When seen in the z direction, the gate G is disposed between the source S and the drain D. The gate G controls the flow of electric charge between the source S and the drain D. The source S and the drain D are names defined on the basis of the flowing direction of a current, and positions thereof are changed in accordance with the flowing direction of the current. A positional relation between the source S and the drain D illustrated in the drawing is an example, and the positional relation between the source S and the drain D of each transistor Tr may be the opposite.

The laminated structure LS includes a first element group, a second element group, wiring lines, and insulators In. The first element group includes a plurality of domain wall movement elements 100. The second element group includes a plurality of domain wall movement elements 110. The first element group and the second element group are disposed at different layers. The second element group is disposed at a position farther from the substrate Sb than the first element group. For example, the first element group forms a first circuit C1 and performs a first product-sum operation. For example, the second element group forms a second circuit C2 and performs a second product-sum operation. In other words, the first element group and the second element group, for example, are responsible for operations between different layers of the neural network NN illustrated in the drawing.

Layers are layers that are divided in accordance with functions. The laminated structure LS is produced through repetition of a stacking process and a processing process, and a unit stacked in each stacking process becomes a layer in many cases. In the laminated structure LS, for example, a wiring line layer including in-plane layer wiring lines and an element layer including domain wall movement elements are alternately stacked. Two or more element layers may be provided.

A plurality of domain wall movement elements 100 and 110 and the wiring lines are disposed inside the insulators In. The insulator In is formed for each layer. For example, the insulator In is divided into insulators In1, In2, In3, and In4 for each layer. The insulator In insulates wiring lines of multi-layer wiring lines and elements from each other. For example, the insulator In is silicon oxide (SiOx), silicon nitride (SiNx), silicon carbide (SiC), chromium nitride, silicon carbonitride (SiCN), silicon oxynitride (SiON), aluminum oxide (Al2O3), zirconium oxide (ZrOx), or the like.

The wiring line has conductivity. For example, the wiring line contains at least one selected from the group consisting of Ag, Cu, Co, Al, and Au. As the wiring lines, there are in-plane wiring lines and via wiring lines VL. The in-plane wiring line is a wiring line that extends in one direction inside the xy plane. The via wiring line VL is a wiring line that extends in the z direction. For example, the via wiring line VL connects elements that are disposed in different layers. The via wiring line VL may be a through wiring line that penetrates an adjacent layer and reaches layers with the adjacent layer interposed therebetween or a substrate. For example, the through wiring line connects each of the domain wall movement elements 100 and 110 and transistors Tr of the substrate Sb and penetrates part of the insulator In in the z direction. For example, the through wiring line is continuous in the z direction.

For example, the read lines RL, the write lines WL, the common lines CL, wiring lines connecting these and the via wiring lines VL, and wiring lines connecting the via wiring lines VL are in-plane wiring lines. For example, the in-plane wiring lines are disposed in a layer between the substrate Sb and the first element group and a layer between the first element group and the second element group. For example, the read lines RL extend in the x direction. As the read lines RL, for example, there are read lines RL1 connected to the domain wall movement elements 100 and read lines RL2 connected to the domain wall movement element 110. The read lines RL1 and RL2, for example, are connected to ferromagnetic layers 20 and 60 of the domain wall movement elements 100 and 110 through electrodes E. For example, the write lines WL extend in the x direction. The write line WL is, for example, connected to the via wiring line VL reaching the transistor Tr through a wiring line extending in the y direction. For example, the common line CL extends in the y direction.

The domain wall movement elements 100 and the domain wall movement elements 110 are disposed in different layers of the laminated structure LS. The domain wall movement elements 100 are disposed in a first layer, and the domain wall movement elements 110 are disposed in a second layer. By disposing the domain wall movement elements 100 and 110 in different layers, the transistors Tr can be used without any omission, and the integration of the integrated device ID is improved. For example, each of the domain wall movement elements 100 and 110 is connected to one of the transistors Tr of the substrate Sb. For example, transistors Tr that are adjacent to each other in the x direction are connected to the domain wall movement elements 100 and 110 of different layers. For example, transistors Tr in a first column and a third column aligned in the y direction control the domain wall movement elements 100, and transistors Tr in a second column and a fourth column control the domain wall movement elements 110.

Any one of the domain wall movement elements 110 of the second element group partly overlaps one of the domain wall movement elements 100 of the first element group when seen in the z direction. When the domain wall movement elements 100 and 110 of different layers are disposed to overlap each other in the z direction, the number of domain wall movement elements 100 and 110 that can be housed inside a predetermined area is increased, and the integration of the integrated device ID is improved.

Figure 8:
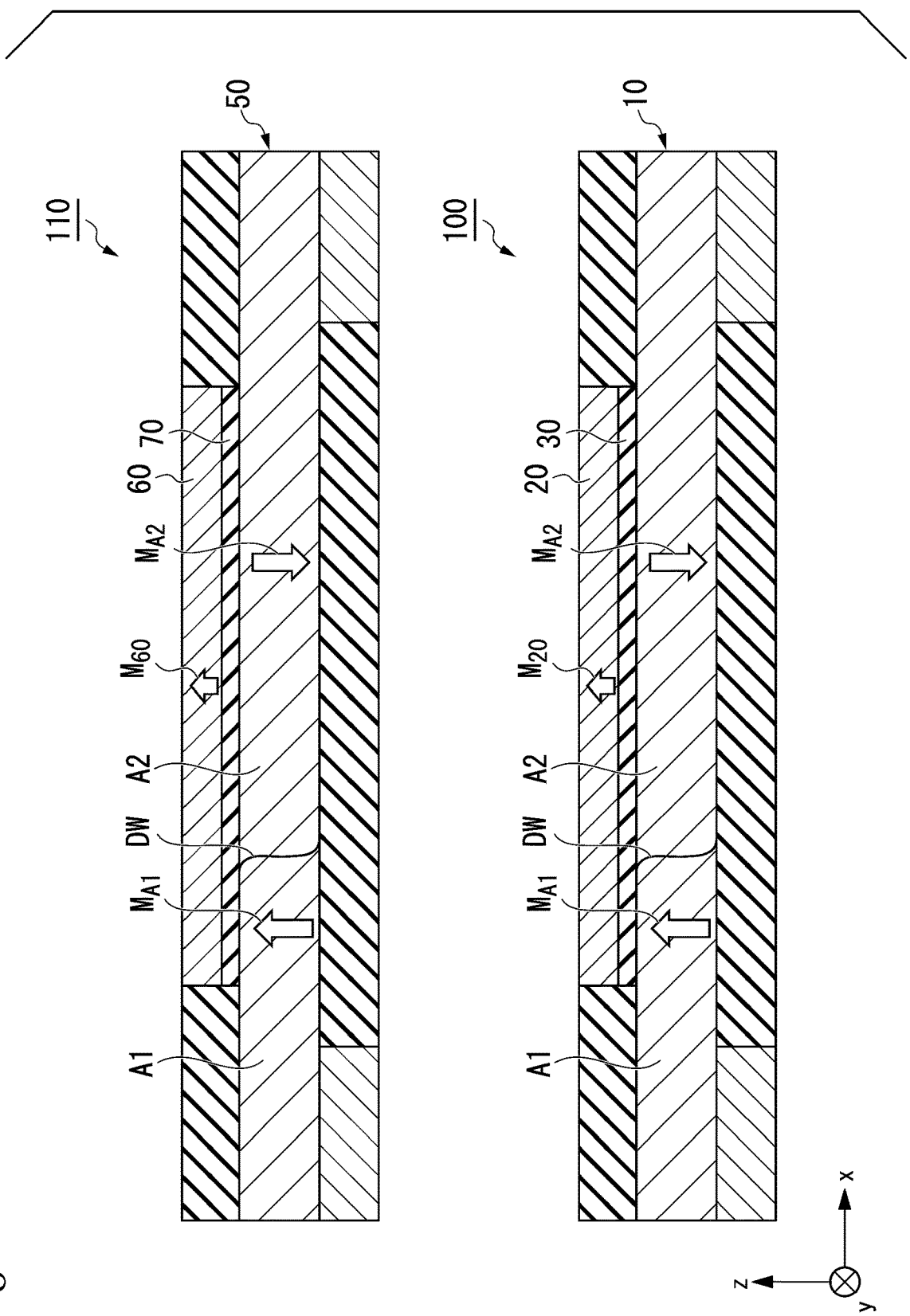
FIG. 8 is a cross-sectional view of a domain wall movement element of a first element group and a domain wall movement element of a second element group of the integrated device according to the first embodiment.
Figure 9:
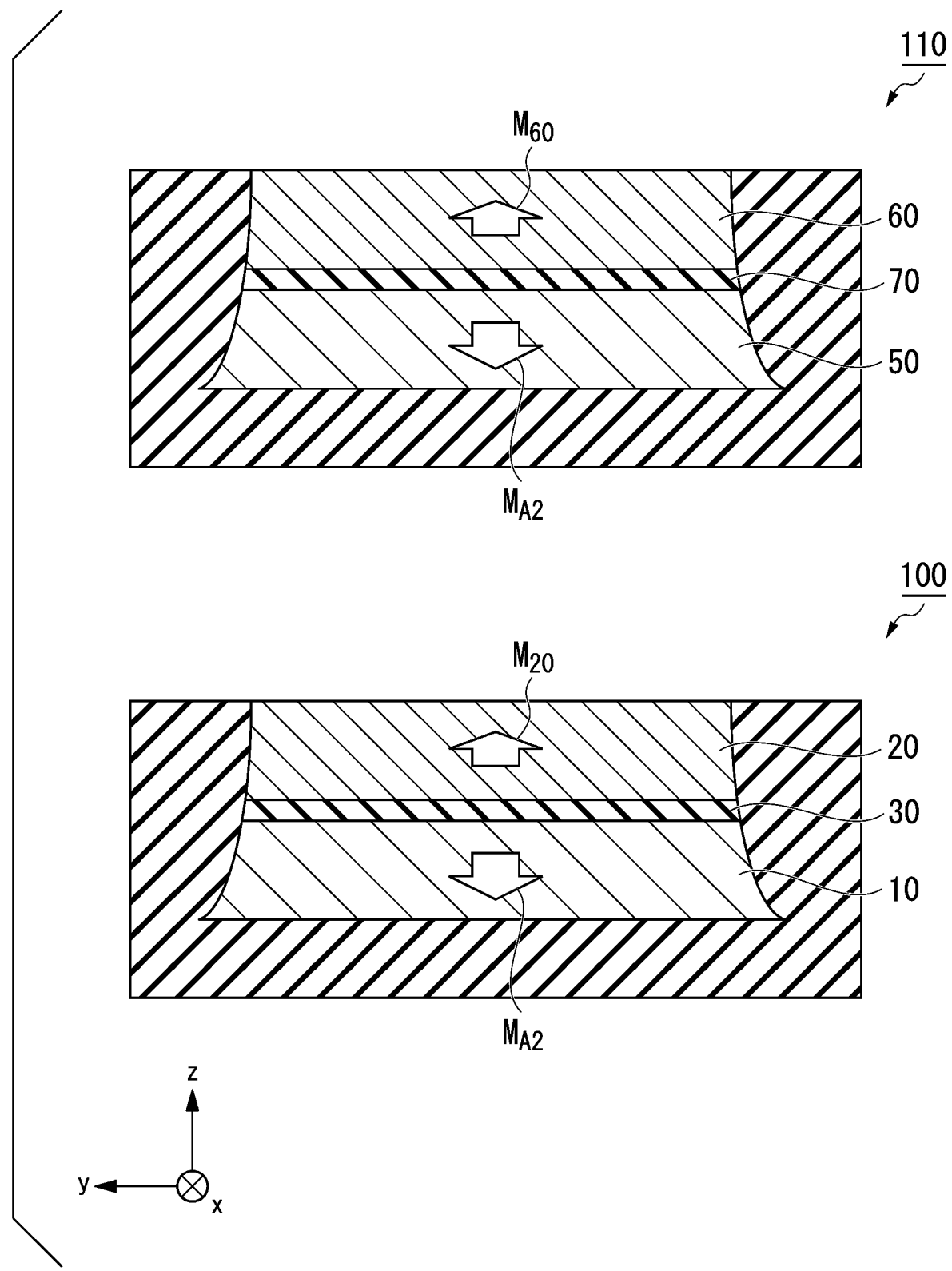
FIG. 9 is another cross-sectional view of a domain wall movement element of the first element group and a domain wall movement element of the second element group of the integrated device according to the first embodiment.

FIG. 8 is a cross-sectional view of the domain wall movement element 100 of the first element group and the domain wall movement element 110 of the second element group of the integrated device ID according to the first embodiment. FIG. 8 is a cross-section of the domain wall movement elements 100 and 110 taken along the xz plane passing through the centers of widths of the domain wall movement layers 10 or 50 in the y direction. FIG. 9 is another cross-sectional view of a domain wall movement element 100 of the first element group and a domain wall movement element 110 of the second element group of the integrated device ID according to the first embodiment. FIG. 9 is a cross-section of the domain wall movement elements 100 and 110 taken along the yz plane passing through the centers of the domain wall movement layers 10 or 50 in the x direction.

The domain wall movement element 100 includes a domain wall movement layer 10, a non-magnetic layer 30, and a ferromagnetic layer 20. For example, the domain wall movement layer 10 is closer to the substrate Sb than the ferromagnetic layer 20. The domain wall movement element 110 includes a domain wall movement layer 50, a non-magnetic layer 70, and a ferromagnetic layer 60. For example, the domain wall movement layer 50 is closer to the substrate Sb than the ferromagnetic layer 60. The domain wall movement element 100 and the domain wall movement element 110 have approximately the same configuration and the same shape. Each of the domain wall movement elements 100 and 110 is a three terminal magnetoresistance effect element and has a length in the x direction which is larger than a length in the y direction.

The domain wall movement layers 10 and 50 extend in the x direction, respectively. Each of the domain wall movement layers 10 and 50, for example, has a rectangular shape that has a long axis in the x direction and a short axis in the y direction on the plan view from the z direction. The domain wall movement layers 10 and 50 respectively face the ferromagnetic layers 20 and 60 with the non-magnetic layers 30 and 70 interposed therebetween. Each of the domain wall movement layers 10 and 50 has a first end connected to the first switching element SW1 and a second end connected to the second switching element SW2.

Each of the domain wall movement layers 10 and 50 contains a ferromagnetic material. Each of the domain wall movement layers 10 and 50 is a layer that can magnetically record information using a change in an internal magnetic state. Each of the domain wall movement layers 10 and 50 can be configured to have a first magnetic domain A1 and a second magnetic domain A2 of which magnetic states are different from each other. For example, the magnetization $M_{A1}$ of the first magnetic domain A1 and the magnetization $M_{A2}$ of the second magnetic domain A2 are aligned in opposite directions. For example, the magnetization $M_{A1}$ of the first magnetic domain A1 is aligned in the +z direction, and the magnetization $M_{A2}$ of the second magnetic domain A2 is aligned in the −z direction. A boundary between the first magnetic domain A1 and the second magnetic domain A2 is a domain wall DW. Each of the domain wall movement layers 10 and 50 can be configured to have a domain wall DW inside.

When the domain wall DW moves, a ratio between the first magnetic domain A1 and the second magnetic domain A2 in the domain wall movement layers 10 and 50 changes. By causing a write current to flow in the x direction of the domain wall movement layers 10 and 50, the domain wall DW moves. When the ratio between the first magnetic domain A1 and the second magnetic domain A2 changes in the domain wall movement layers 10 and 50, resistance values of the domain wall movement elements 100 and 110 change. The resistance value of the domain wall movement element 100 or 110 changes in accordance with a relative angle of magnetizations of ferromagnetic layers having the non-magnetic layer 30 or 70 interposed therebetween. The resistance values of the domain wall movement elements 100 and 110 respectively change in accordance with relative angles between the magnetizations $M_{A1}$ and $M_{A2}$ of the domain wall movement layers 10 and 50 and the magnetizations $M_{20}$ and $M_{60}$ of the ferromagnetic layers 20 and 60. When the ratio of the first magnetic domain A1 increases, the resistance values of the domain wall movement elements 100 and 110 decrease, and, when the ratio of the second magnetic domain A2 increases, the resistance values of the domain wall movement elements 100 and 110 increase. For example, by changing the position of the domain wall DW, the resistance values of the domain wall movement elements 100 and 110 change in an analog manner. The resistance values of the domain wall movement elements 100 and 110 correspond to weighting factors in a transmission means in the neural network NN.

A critical current density of the domain wall movement layer 50 is lower than a critical current density of the domain wall movement layer 10. In a case in which there is a deviation in critical current densities inside the domain wall movement layers 10 and 50 or in a plurality of domain wall movement elements 100 or 110, for example, a maximum value of the critical current density of the domain wall movement layer 50 is smaller than a minimum value of the critical current density of the domain wall movement layer 10. The critical current density is a current density that is required for moving the domain wall DW. In other words, an energy required for moving the domain wall DW is lower in the domain wall movement layer 50 than in the domain wall movement layer 10, and it is easier to move the domain wall DW in the domain wall movement layer 50 than in the domain wall movement layer 10. In addition, the moving speed of the domain wall DW of the domain wall movement layer 50 is higher than the moving speed of the domain wall DW of the domain wall movement layer 10.

The moving speed v of the domain wall DW is a value acquired by dividing a movement distance of the domain wall DW by a cumulative time of write pulses. For example, when the length of the domain wall movement layer 10 and 50 that respectively overlaps the ferromagnetic layers 20 and 60 is L, the length of a signal of a write pulse is t, and the number of write pulses required for changing the resistance value of the domain wall movement element 100 or 110 from a maximum to a minimum is n, the moving speed v of the domain wall DW can be represented as v=L/(t×n).

Figure 10:
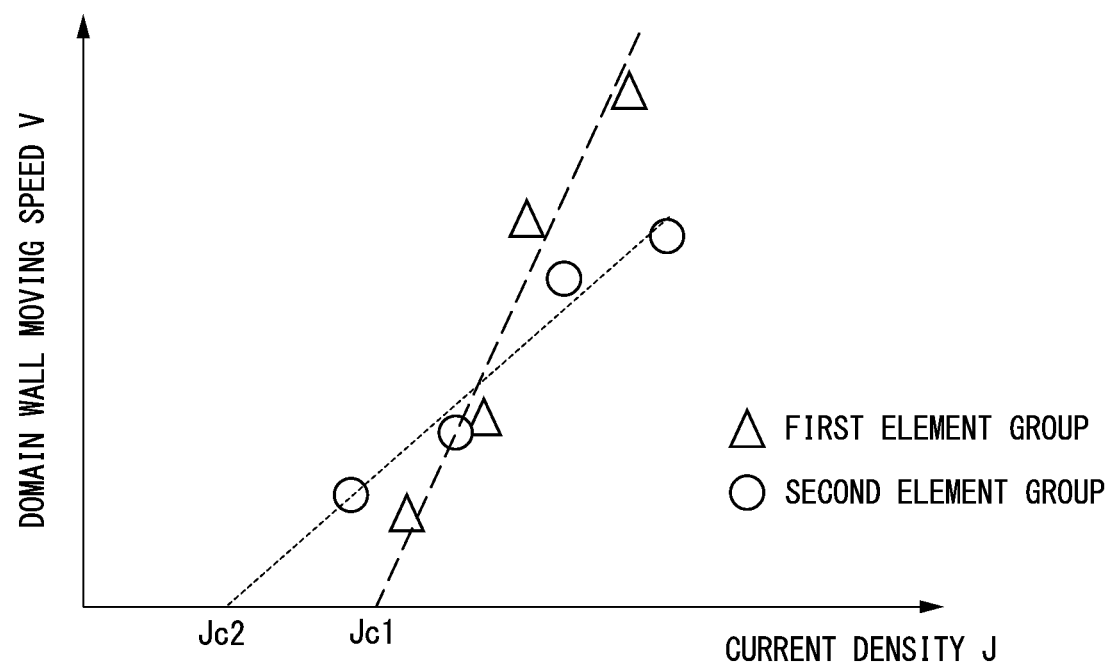
FIG. 10 is a diagram illustrating a relation between a domain wall moving speed of a domain wall movement layer and a critical current density.

The critical current density can be evaluated on the basis of a relation between a moving speed v of the domain wall DW and a current density J. First, a change in the moving speed v of the domain wall DW at the time of changing a signal amplitude of a write pulse is evaluated. Next, a current density J of each write pulse is acquired on the basis of a current value and a cross-sectional area of the domain wall movement layers 10 and 50, and the moving speed v of the domain wall DW and the current density J of the write pulse are plotted on a graph. FIG. 10 is a result of plotting of the moving speed v of the domain wall DW and the current density J of the write pulse on a graph. Thereafter, an approximate straight line is drawn for plot points, and current densities J at the time when the moving speed v of the domain wall DW becomes 0 are defined as critical current densities Jc1 and Jc2.

The critical current densities of the domain wall movement layers 10 and 50 and the moving speed of the domain wall DW can be changed using compositions, materials, shapes, and the like of the domain wall movement layers 10 and 50.

For example, the domain wall movement layer 10 and the domain wall movement layer 50 contain different materials. When the composition materials of the domain wall movement layer 10 and the domain wall movement layer 50 are different from each other, saturation magnetization is different between the domain wall movement layer 10 and the domain wall movement layer 50. For example, the saturation magnetization of the domain wall movement layer 50 is smaller than the saturation magnetization of the domain wall movement layer 10. In addition, when the composition materials of the domain wall movement layer 10 and the domain wall movement layer 50 are different from each other, the electrical resistivity is different between the domain wall movement layer 10 and the domain wall movement layer 50. For example, the electrical resistivity of the domain wall movement layer 50 is lower than the electrical resistivity of the domain wall movement layer 10.

Each of the domain wall movement layers 10 and 50 is composed of a magnetic body. Each of the domain wall movement layers 10 and 50 may be composed of a ferromagnetic body, a ferrimagnetic body, or a combination of these and an antiferromagnetic body of which a magnetic state can be changed in accordance with a current. It is preferable that the domain wall movement layers 10 and 50 contain at least one element selected from the group consisting of Co, Ni, Fe, Pt, Pd, Gd, Tb, Mn, Ge, and Ga. The domain wall movement layers 10 and 50 may be composed of the same material as that of the ferromagnetic layers 20 and 60. Examples of the material used for the domain wall movement layers 10 and 50 include a laminated film of Co and Ni, a laminated film of Co and Pt, a laminated film of Co and Pd, a MnGa-based material, a GdCo-based material, and a TbCo-based material. A ferrimagnetic body of the MnGa-based material, the GdCo-based material, the TbCo-based material, or the like has low saturation magnetization and a small critical current required for moving the domain wall DW. In addition, the laminated film of Co and Ni, the laminated film of Co and Pt, and the laminated film of Co and Pd has a large coercive force and has a low moving speed of the domain wall DW. Examples of the antiferromagnetic body include $Mn_3X$ (here, X is Sn, Ge, Ga, Pt, Ir, or the like), CuMnAs, $Mn_2Au$, and the like.

For example, the non-magnetic layer 30 is stacked on the domain wall movement layer 10. For example, the non-magnetic layer 70 is stacked on the domain wall movement layer 50. The non-magnetic layers 30 and 70 are respectively disposed between the domain wall movement layers 10 and 50 and the ferromagnetic layers 20 and 60.

For example, the non-magnetic layers 30 and 70 are formed of a non-magnetic insulator, a semiconductor, or a metal. Examples of the non-magnetic insulator include $Al_2O_3$, $SiO_2$, MgO, and $MgAl_2O_4$, and materials in which some of Al, Si, and Mg are substituted with Zn, Be, and the like. Such materials have a large band gap and a superior insulating property. In a case in which the non-magnetic layers 30 and 70 are formed of a non-magnetic insulator, the non-magnetic layers 30 and 70 are tunnel barrier layers. Examples of the non-magnetic metal include Cu, Au, Ag, and the like. Examples of the non-magnetic semiconductor include Si, Ge, $CuInSe_2$, $CuGaSe_2$, $Cu(In,Ga)Se_2$, and the like.

The thickness of each of the non-magnetic layers 30 and 70 is preferably equal to or larger than 20 Å and is more preferably equal to or larger than 30 Å. When the thickness of each of the non-magnetic layers 30 and 70 becomes larger, the resistance area product (RA) of each of the domain wall movement elements 100 and 110 increases. The resistance area product (RA) of each of the domain wall movement elements 100 and 110 is preferably equal to or larger than $1\times10^4$ $\Omega\mu m^2$ and is more preferably equal to or larger than $1\times10^5$ $\Omega\mu m^2$. The resistance area products (RA) of the domain wall movement elements 100 and 110 are represented by products of the element resistance of one domain wall movement element 100 or 110 and element cross-sectional areas of the domain wall movement elements 100 and 110 (areas of cut faces of the non-magnetic layers 30 and 70 cut along the xy plane).

The ferromagnetic layer 20 is disposed on the non-magnetic layer 30. The ferromagnetic layer 60 is disposed on the non-magnetic layer 70. The ferromagnetic layer 20 has magnetization $M_{20}$ aligned in one direction. The ferromagnetic layer 60 has magnetization $M_{60}$ aligned in one direction. When a predetermined external force is applied, it is more difficult for the magnetizations $M_{20}$ and $M_{60}$ of the ferromagnetic layers 20 and 60 to be reversed than the magnetizations $M_{A1}$ and $M_{A2}$ of the first magnetic domain A1 and the second magnetic domain A2. For example, the predetermined external force is an external force applied to magnetization in accordance with an external magnetic field or an external force applied to magnetization in accordance with a spin-polarized current. The ferromagnetic layers 20 and 60 may be called as magnetization fixed layers, magnetization reference layers, or the like.

Each of the ferromagnetic layers 20 and 60 includes a ferromagnetic body. For example, the ferromagnetic layers 20 and 60 contain materials easily exhibiting a coherent tunnel effect between the ferromagnetic layers 20 and 60 and the domain wall movement layers 10 and 50. For example, each of the ferromagnetic layers 20 and 60 contains a metal selected from the group consisting of Cr, Mn, Co, Fe, and Ni, an alloy containing one or more of such metals, an alloy containing such a metal and at least one of B, C, and N, and the like. For example, the ferromagnetic layers 20 and 60 are Co—Fe, Co—Fe—B, and Ni—Fe.

For example, the ferromagnetic layers 20 and 60 may be formed of a Heusler alloy. The Heusler alloy is a half metal and has a high spin polarization rate. The Heusler alloy is an intermetallic compound having a chemical composition of XYZ or $X_2YZ$. Here, X is a transition metal element of group Co, Fe, Ni, or Cu or a precious metal element on a periodical table, Y is a transitional metal of group Mn, V, Cr, or Ti or an element type of X, and Z is a typical element of group III to group V. Examples of the Heusler alloy include $Co_2FeSi$, $Co_2FeGe$, $Co_2FeGa$, $Co_2MnSi$, $Co_2Mn_{1-a}Fe_aAl_bS_{1-b}$, $Co_2FeGe_{1-c}Ga_c$, and the like.

On a face of each of the ferromagnetic layers 20 and 60 that is on a side opposite to the non-magnetic layer 30 or 70, a magnetic layer may be disposed with a spacer layer in between. The ferromagnetic layer 20 or 60, the spacer layer, and the magnetic layer is a synthetic antiferromagnetic structure (SAF structure). The synthetic antiferromagnetic structure is formed from two magnetic layers having a non-magnetic layer interposed therebetween. By antiferromagnetically coupling the ferromagnetic layer 20 or 60 and the magnetic layer, the coercive force of the ferromagnetic layer 20 or 60 is larger than that of case in which no magnetic layer is included. For example, the magnetic layer contains a ferromagnetic substance and may contain an antiferromagnetic substance such as IrMn and PtMn. For example, the spacer layer contains at least one selected from the group consisting of Ru, Ir, and Rh.

The direction of magnetization of each of the layers of the domain wall movement elements 100 and 110 can be checked, for example, by measuring a magnetization curve. The magnetization curve, for example, can be measured using a magneto optical Kerr effect (MOKE). The measurement using the MOKE is a measurement method performed using the magneto optical effect (magnetic Kerr effect) in which linear polarized light is caused to be incident to a measurement target object, and rotation and the like in a polarization direction thereof occur.

Up to here, although description has been presented using an example in which magnetization is aligned in the z-axis direction, the magnetization of the domain wall movement layers 10 and 50 and the ferromagnetic layer 20 may be aligned in any one direction in the xy plane. In a case in which the magnetization is aligned in the z direction, power consumption and operation-time heat dissipation of the domain wall movement elements 100 and 110 are inhibited more than those of a case in which the magnetization is aligned in the xy plane. In addition, in a case in which the magnetization is aligned in the z direction, a movement width of the domain wall DW at the time of applying a pulse current of the same intensity is smaller than that of a case in which the magnetization is aligned in the xy plane. On the other hand, in a case in which the magnetization is aligned in one direction in the xy plane, a width of change in the magnetoresistance (an MR ratio) of the domain wall movement element is larger than that of a case in which the magnetization is aligned in the z direction.

Next, a method of manufacturing the integrated device ID will be described. The integrated device ID is formed by a lamination process of each layer and a working process in which part of each layer is processed into a predetermined shape. For the lamination of each layer, a sputtering method, a chemical vapor deposition (CVD) method, an electronic beam vapor deposition method (EB vapor deposition method), an atom laser deposition method, or the like can be used. The processing of each layer can be performed using photolithography or the like.

First, sources S and drains D are formed by doping impurities at predetermined positions in a substrate Sb. Next, a gate insulating film GI and a gate G are formed between each source S and each drain D. The source S, the drain D, the gate insulating film GI, and the gate G form a transistor Tr. As the substrate Sb, a semiconductor substrate that is commercially available in which transistors Tr are periodically disposed may be used.

Next, a wiring line layer up to a first layer is formed. The wiring line layer can be manufactured using photolithography.

Next, a first element group of the first layer is manufactured. First, a ferromagnetic layer, a non-magnetic layer, and a ferromagnetic layer are sequentially stacked, and these are processed into a predetermined shape. The ferromagnetic layer, the non-magnetic layer, and the ferromagnetic layer respectively form the domain wall movement layer 10, the non-magnetic layer 30, and the ferromagnetic layer 20. Also the first element group can be manufactured using the photolithography.

Next, in a similar procedure, by manufacturing a wiring line layer between the first layer and the second layer and a second element group of the second layer, an integrated device ID can be obtained. The second element group can be manufactured in a procedure similar to that of the first element group. By sequentially stacking a ferromagnetic layer, a non-magnetic layer, and a ferromagnetic layer and processing them in a predetermined shape, the ferromagnetic layer, the non-magnetic layer, and the ferromagnetic layer respectively becomes the domain wall movement layer 50, the non-magnetic layer 70, and the ferromagnetic layer 60.

According to the integrated device ID of the first embodiment, a performance deviation between the constituent domain wall movement elements is small, and controllability is superior as a whole. Hereinafter, the reason for this will be described.

As described above, the integrated device ID is stacked on the substrate Sub in a stepped manner. For this reason, as a stacking surface becomes farther from the substrate Sub, it is difficult to secure the flatness of the stacking surface. In other words, a stacking surface on which the domain wall movement element 110 is stacked has a degree of flatness lower than that of a stacking surface on which the domain wall movement element 100 is stacked. Thus, a degree of surface roughness of the upper face and the lower face of the domain wall movement layer 50 is higher than a degree of surface roughness of the upper face and the lower face of the domain wall movement layer 10.

The unevenness of the surfaces of the domain wall movement layers 10 and 50 serves as a trap site of the domain wall DW. The domain wall DW has its movement in the x direction inhibited in accordance with the unevenness and is trapped. In other words, the domain wall DW of the domain wall movement layer 50 is more easily trapped than the domain wall DW of the domain wall movement layer 10.

In contrast to this, in the integrated device ID according to this embodiment, an energy required for moving the domain wall DW is lower in the domain wall movement layer 50 than in the domain wall movement layer 10, and the domain wall DW can be easily moved in the domain wall movement layer 50 more than in the domain wall movement layer 10. When the domain wall DW of the domain wall movement layer 50 becomes easier to be moved, it becomes more difficult for the domain wall DW to be trapped at a trap site. By avoid trapping of the domain wall DW in the domain wall movement layer 50, a difference between behaviors of the domain wall movement element 100 of the first element group and the domain wall movement element 110 of the second element group can be reduced.

When the integrated device ID is operated, a pulse length of a write pulse input to the domain wall movement element 110 belonging to the second element group may be configured to be longer than a pulse length of a write pulse input to the domain wall movement element 100 belonging to the first element group. In addition, a pulse amplitude of a write pulse input to the domain wall movement element 110 belonging to the second element group may be configured to be larger than a pulse amplitude of a write pulse input to the domain wall movement element 100 belonging to the first element group. By increasing the magnitude (a pulse length and a pulse amplitude) of a write pulse applied to the domain wall movement layer 50, the domain wall DW can be further inhibited from being trapped in a trap site. For example, the magnitude of the pulse is controlled by a write circuit connected to the integrated device ID.

Second Embodiment

Figure 11:
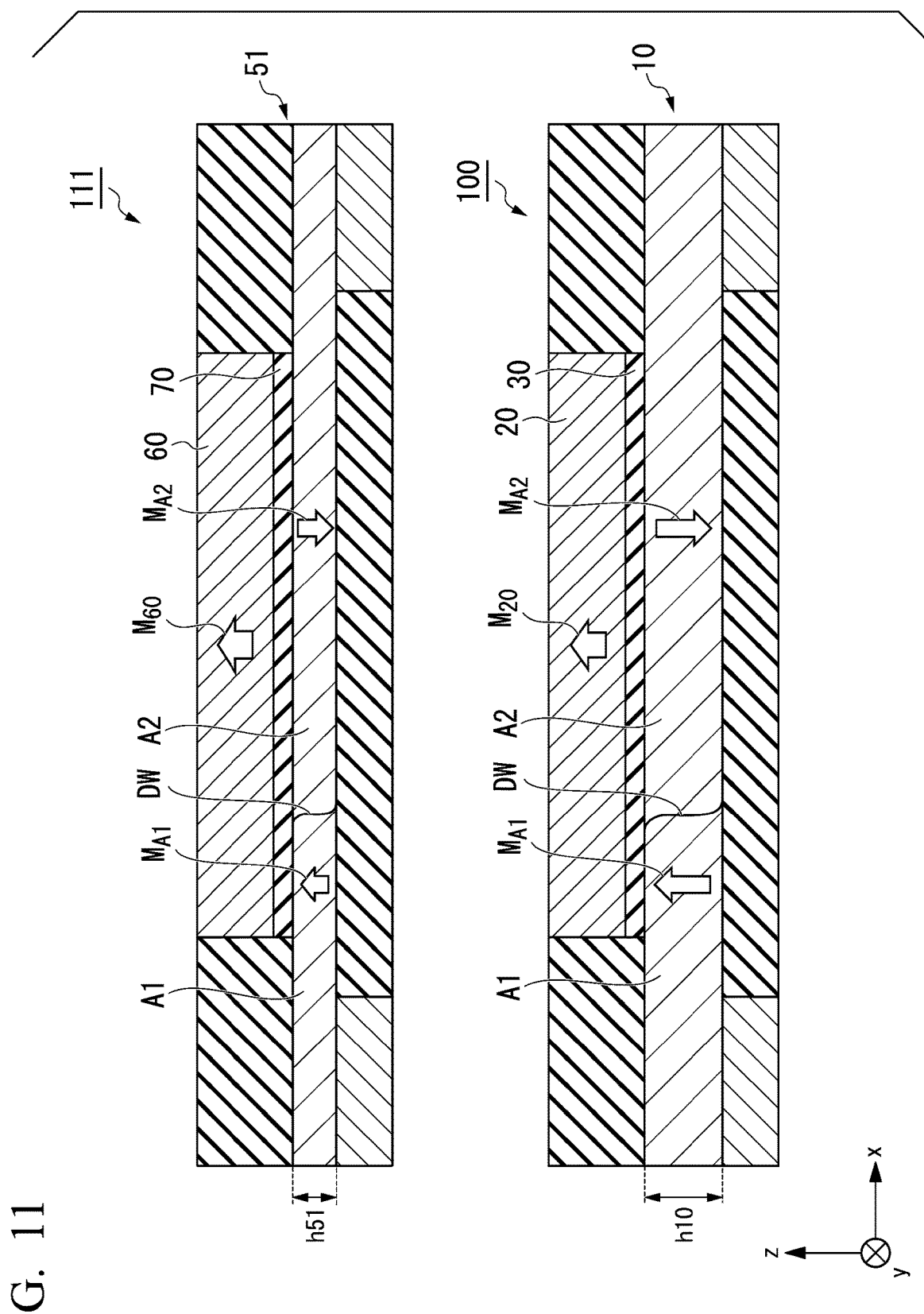
FIG. 11 is a cross-sectional view of a domain wall movement element of a first element group and a domain wall movement element of a second element group of an integrated device according to a second embodiment.

FIG. 11 is a cross-sectional view of a domain wall movement element 100 of a first element group and a domain wall movement element 111 of a second element group of an integrated device according to a second embodiment. FIG. 11 is a cross-section of the domain wall movement elements 100 and 111 cut along an xz plane passing through the center of the width of domain wall movement layers 10 and 51 in the y direction. In the integrated device according to the second embodiment, the domain wall movement element 111 is different from that of the first embodiment. In the second embodiment, the same reference signs will be assigned to the same components as those according to the first embodiment, and description thereof will be omitted.

The domain wall movement element 111 includes a domain wall movement layer 51, a non-magnetic layer 70, and a ferromagnetic layer 60. The thickness of the domain wall movement layer 51 is different from that of the domain wall movement layer 50 according to the first embodiment. The thickness h51 of the domain wall movement layer 51 of the domain wall movement element 111 belonging to a second element group is smaller than the thickness h10 of the domain wall movement layer 10 of the domain wall movement element 100 belonging to a first element group.

Since the thickness h51 of the domain wall movement layer 51 is small, the cross-sectional area of the domain wall movement layer 51 becomes small, and a current density of the domain wall movement layer 51 increases. In accordance with the increase in the current density of the domain wall movement layer 51, the moving speed of the domain wall DW of the domain wall movement layer 51 increases. Thus, also according to the integrated device of the second embodiment, by avoiding the domain wall DW in the domain wall movement layer 50 from being trapped, a difference between behaviors of the domain wall movement element 100 of the first element group and the domain wall movement element 110 of the second element group can be reduced.

According to the integrated device of the second embodiment, critical current densities of the domain wall movement layers 10 and 51 and a moving speed of the domain wall DW are changed in accordance with a difference between shapes of the domain wall movement layer 10 and the domain wall movement layer 51. Thus, in the integrated device according to the second embodiment, materials composing the domain wall movement layers 10 and 51 may be the same. For example, the domain wall movement layer 10 is $[Co_2/Pd_6]_8$, and the domain wall movement layer 50 is $[Co_2/Pd_5]_6$.

Third Embodiment

Figure 12:
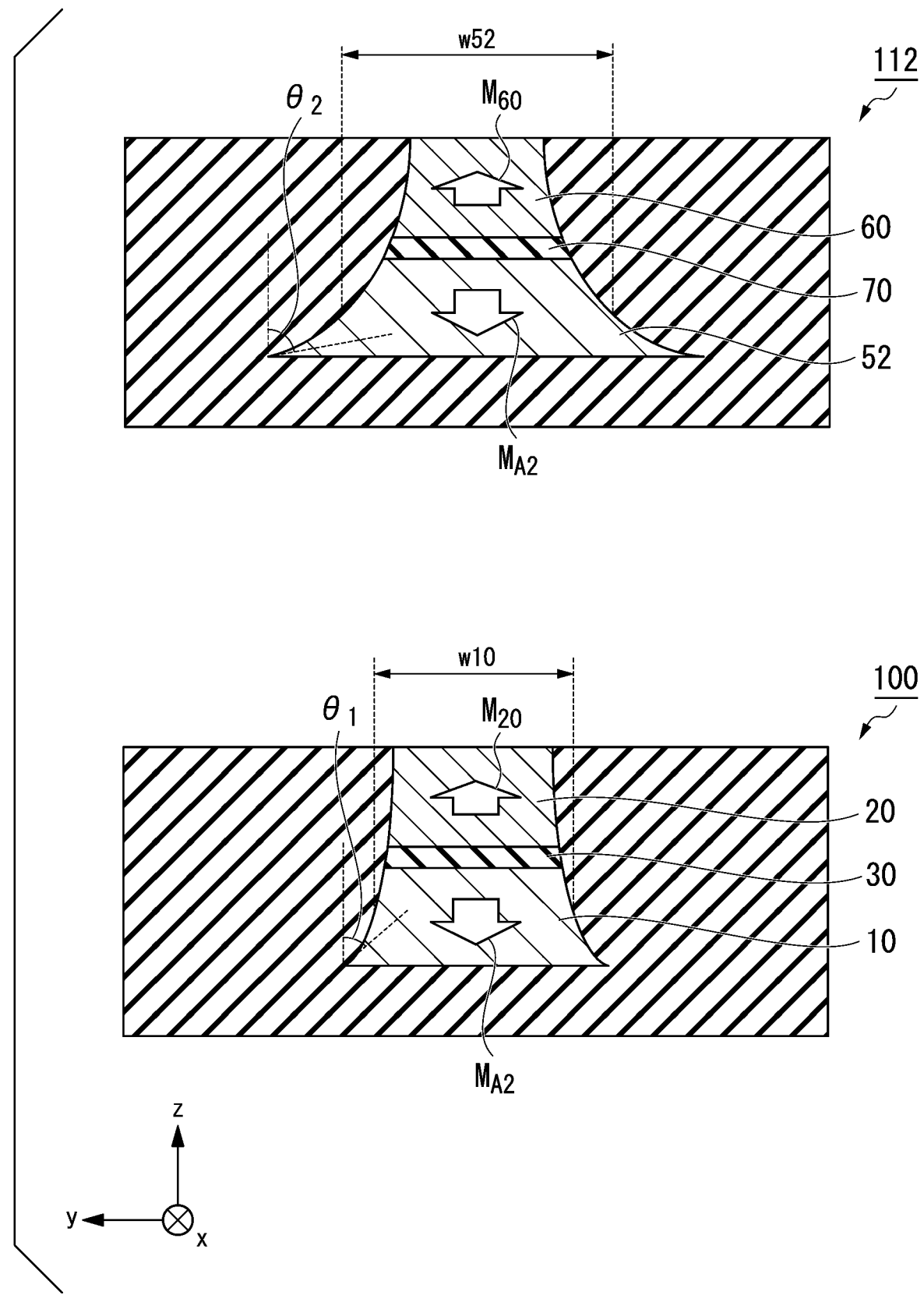
FIG. 12 is a cross-sectional view of a domain wall movement element of a first element group and a domain wall movement element of a second element group of an integrated device according to a third embodiment.

FIG. 12 is a cross-sectional view of a domain wall movement element 100 of a first element group and a domain wall movement element 112 of a second element group of an integrated device according to a third embodiment. FIG. 12 is a cross-section of the domain wall movement elements 100 and 112 cut along a yz plane passing through the center of domain wall movement layers 10 and 52 in the x direction. In the integrated device according to the third embodiment, the domain wall movement element 112 is different from that according to the first embodiment. In the third embodiment, the same reference signs will be assigned to the same components as those according to the first embodiment, and description thereof will be omitted.

The domain wall movement element 112 includes a domain wall movement layer 52, a non-magnetic layer 70, and a ferromagnetic layer 60. A shape of a yz cross-section of the domain wall movement layer 52 is different from that of the domain wall movement layer 50 according to the first embodiment. A width w52 of the domain wall movement layer 52 of the domain wall movement element 112 that belongs to the second element group in the y direction is different from a width w10 of the domain wall movement layer 10 of the domain wall movement element 100 that belongs to the first element group in the y direction. Here, a width of the domain wall movement layer in the y direction represents an average of widths of an upper face and a lower face in the y direction.

There is a report indicating that a critical current density of a domain wall movement layer is a minimum near a line width of 70 nm (for example, T. Koyama, et al., Nat. Mater. 10, 194 (2011)). Thus, in a case in which a line width of the domain wall movement layer is larger than 70 nm, it is preferable that the width w52 of the domain wall movement layer 52 be smaller than the width w10 of the domain wall movement layer 10. On the other hand, in a case in which the line width of the domain wall movement layer is smaller than 70 nm, it is preferable that the width w52 of the domain wall movement layer 52 be larger than the width w10 of the domain wall movement layer 10. By satisfying the relation described above, the critical current density of the domain wall movement layer 52 can be configured to be lower than the critical current density of the domain wall movement layer 10. Thus, by avoiding the domain wall DW being trapped in the domain wall movement layer 52, a difference between behaviors of the domain wall movement element 100 of the first element group and the domain wall movement element 110 of the second element group can be reduced.

In addition, an inclination angle $\theta_2$ of a side face of the domain wall movement layer 52 with respect to the z direction may be larger than an inclination angle $\theta_1$ of a side face of the domain wall movement layer 10 with respect to the z direction. Magnetization is strongly influenced by the surfaces of the domain wall movement layers 10 and 52. For example, in a case in which the side faces of the domain wall movement layers 10 and 52 are inclined, magnetic anisotropy becomes weak near the side faces. When the magnetic anisotropy becomes weak, it becomes easy for the magnetization to be reversed, and it becomes easy for the domain wall DW to be moved. Since the inclination angle $\theta_2$ of the domain wall movement layer 52 is larger than the inclination angle $\theta_1$ of the domain wall movement layer 10, by avoiding the domain wall DW from being trapped in the domain wall movement layer 52, a difference between behaviors of the domain wall movement element 100 of the first element group and the domain wall movement element 110 of the second element group can be reduced.

The integrated device according to the third embodiment changes the critical current densities of the domain wall movement layers 10 and 52 and the moving speed of the domain wall DW in accordance with a difference between the shapes of the domain wall movement layer 10 and the domain wall movement layer 52. Thus, in the integrated device according to the third embodiment, materials composing the domain wall movement layers 10 and 52 may be the same.

Fourth Embodiment

Figure 13:
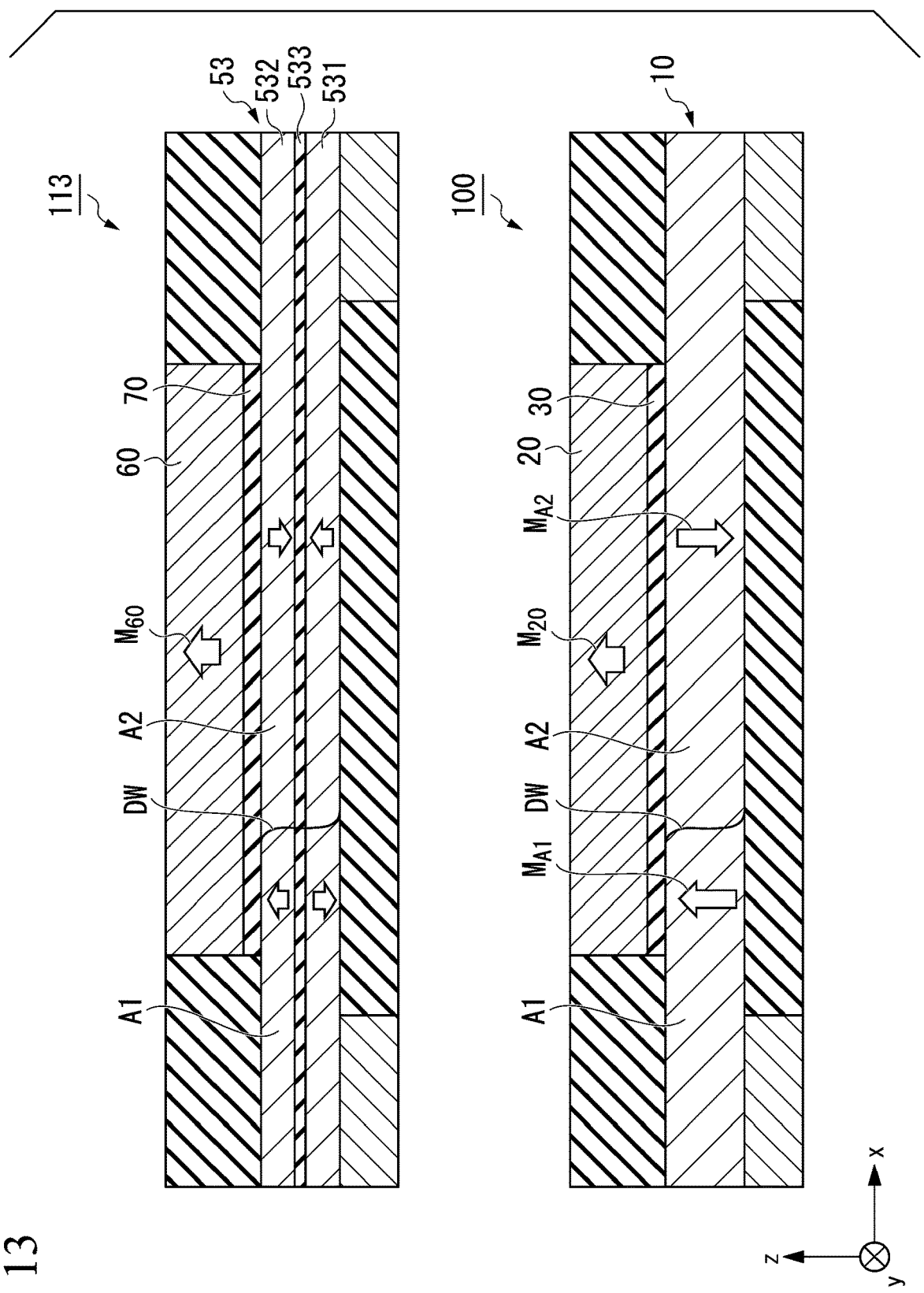
FIG. 13 is a cross-sectional view of a domain wall movement element of a first element group and a domain wall movement element of a second element group of an integrated device according to a fourth embodiment.

FIG. 13 is a cross-sectional view of a domain wall movement element 100 of a first element group and a domain wall movement element 113 of a second element group of an integrated device according to a fourth embodiment. FIG. 13 is a cross-section of the domain wall movement elements 100 and 113 cut along an xz plane passing through the center of domain wall movement layers 10 and 53 in the y direction. In the integrated device according to the fourth embodiment, the domain wall movement element 113 is different from that according to the first embodiment. In the fourth embodiment, the same reference signs will be assigned to the same components as those according to the first embodiment, and description thereof will be omitted.

The domain wall movement element 113 includes a domain wall movement layer 53, a non-magnetic layer 70, and a ferromagnetic layer 60. The domain wall movement layer 53 includes a ferromagnetic layer 531, a spacer layer 533, and a ferromagnetic layer 532. The spacer layer 533 is interposed between the ferromagnetic layer 531 and the ferromagnetic layer 532 in the z direction. The same material as that of the ferromagnetic layer 20 can be used for the ferromagnetic layers 531 and 532. As the material of the spacer layer 533, at least one selected from the group consisting of Ru, Ir, and Rh can be used.

The ferromagnetic layer 531 and the ferromagnetic layer 532 are magnetically coupled. For example, the ferromagnetic layer 531 and the ferromagnetic layer 532 are antiferromagnetically coupled. The ferromagnetic layer 531, the spacer layer 533, and the ferromagnetic layer 532 form a synthetic antiferromagnetic structure (SAF structure).

In a case in which the domain wall movement layer 53 has the SAF structure, an RKKY torque applies to the magnetization inside the domain wall movement layer 53. As a result, a domain wall of the domain wall movement layer 53 becomes easy to move. Thus, according to the integrated device of the fourth embodiment, the domain wall DW is avoided from being trapped in the domain wall movement layer 53, and a difference between behaviors of the domain wall movement element 100 of the first element group and the domain wall movement element 113 of the second element group can be reduced.

The integrated device according to the fourth embodiment changes the critical current densities of the domain wall movement layers 10 and 53 and the moving speed of the domain wall DW in accordance with a difference between the configurations of the domain wall movement layer 10 and the domain wall movement layer 53. Thus, in the integrated device according to the fourth embodiment, materials composing the domain wall movement layers 10 and 53 may be the same.

Fifth Embodiment

Figure 14:
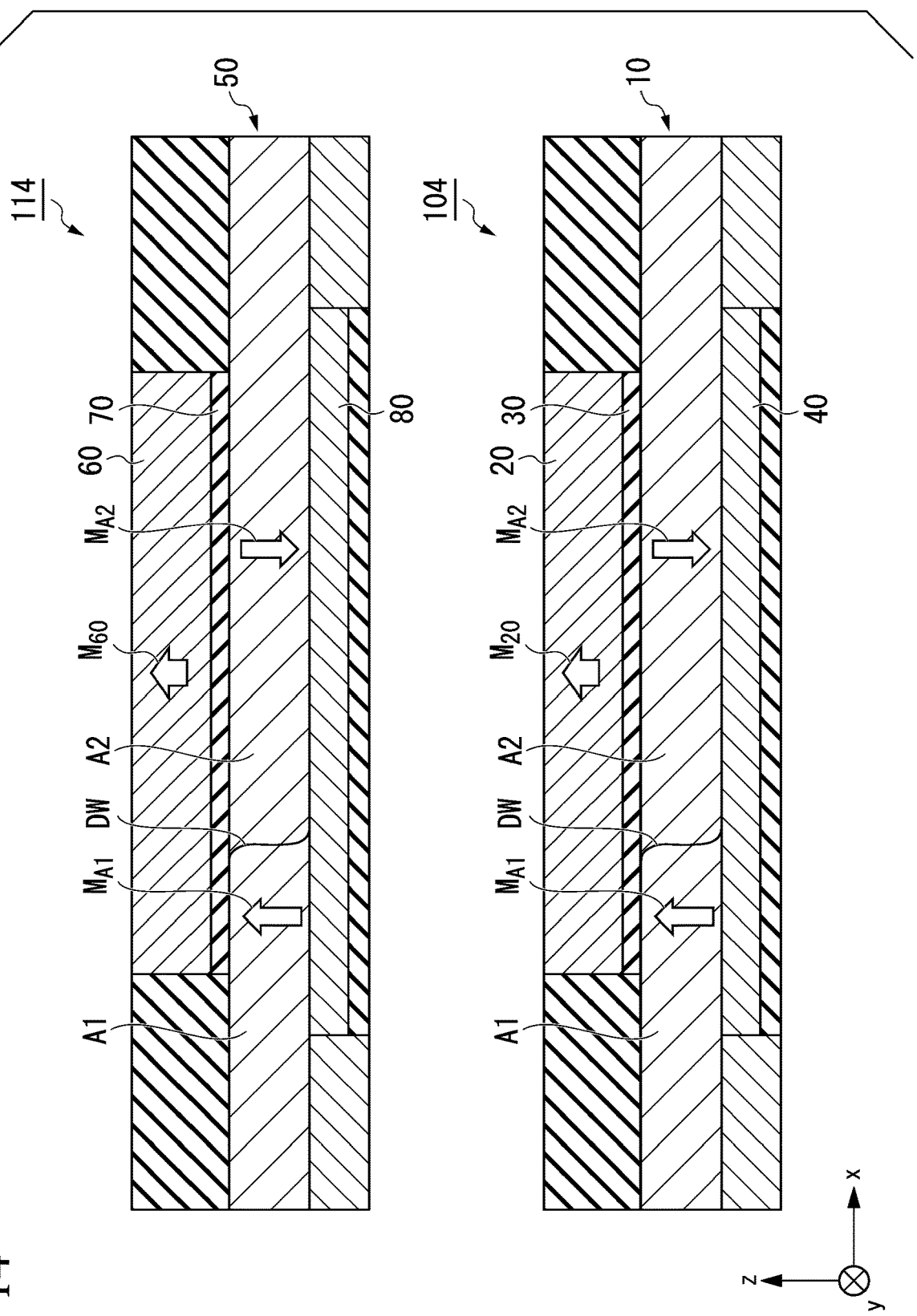
FIG. 14 is a cross-sectional view of a domain wall movement element of a first element group and a domain wall movement element of a second element group of an integrated device according to a fifth embodiment.

FIG. 14 is a cross-sectional view of a domain wall movement element 104 of a first element group and a domain wall movement element 114 of a second element group of an integrated device according to a fifth embodiment. In FIG. 14, each of the domain wall movement elements 104 and 114 includes a wiring line layer 40 or a wiring line layer 80, which is different from the first embodiment. In the fifth embodiment, the same reference signs will be assigned to the same components as those according to the first embodiment, and description thereof will be omitted.

The wiring line layers 40 and 80 are respectively in contact with the domain wall movement layers 10 and 50. The wiring line layers 40 and 80 are disposed at positions at which the non-magnetic layers 30 and 70 and the domain wall movement layers 10 and 50 are respectively interposed in the z direction. For example, the wiring line layers 40 and 80 are disposed at positions overlapping the ferromagnetic layers 20 and 60 in the z direction. The wiring line layer 40 may be disposed between the domain wall movement layers 10 and 50 and a via wiring line VL.

The wiring line layers 40 and 80 generate spin currents in accordance with spin Hall effects at the time when a current flows and inject spins into the domain wall movement layers 10 and 50. For example, the wiring line layers 40 and 80 apply spin orbital torques (SOT) to the magnetizations of the domain wall movement layers 10 and 50. The spin orbital torques (SOT) generated in accordance with the spins injected from the wiring line layers 40 and 80 assist movement of the domain walls DW. The domain walls DW of the domain wall movement layers 10 and 50 become easily movable by receiving the spin orbital torques (SOT).

The wiring line layers 40 and 80 contain any one of a metal, an alloy, an intermetallic compound, a metal boride, a metal carbide, a metal silicide, and a metal phosphide having a function of generating a spin current using a spin Hall effect when a current flows.

For example, each of the wiring line layers 40 and 80 contains a non-magnetic heavy metal as a main element. The main element is an element having the highest proportion among elements composing the wiring line layers 40 and 80. For example, the wiring line layers 40 and 80 contain a heavy metal having a specific gravity equal to or higher than yttrium (Y). A non-magnetic heavy metal has a large atomic number equal to or larger than 39 and has a d electron or an f electron on the outermost shell and thus has a strong spin orbit interaction. The spin Hall effect occurs in accordance with a spin orbit interaction, spins may be easily distributed unevenly inside the wiring line layers 40 and 80, and thus a spin current $J_s$ may be easily generated. For example, each of the wiring line layers 40 and 80 contains any one selected from the group consisting of Au, Hf, Mo, Pt, W, and Ta.

A spin Hall angle of the material composing the wiring line layer 80 is larger than a spin Hall angle of the material composing the wiring line layer 40. The "spin Hall angle" is one of indices representing intensity of the spin Hall effect and represents conversion efficiency of a spin current generated for a current flowing along the wiring line layers 40 and 80. In other words, as the absolute value of the spin Hall angle becomes larger, the amount of spin injected into the domain wall movement layers 10 and 50 increases, and a large spin orbital torque (SOT) is applied to the magnetization.

When the spin Hall angle of the material composing the wiring line layer 80 is larger than the spin Hall angle of the material composing the wiring line layer 40, the domain wall DW of the domain wall movement layer 50 becomes easier to be moved than the domain wall DW of the domain wall movement layer 10. Thus, the integrated device according to the fifth embodiment can reduced the domain wall DW being trapped in the domain wall movement layer 50 and reduce a difference between behaviors of the domain wall movement element 104 of the first element group and the domain wall movement element 114 of the second element group.

The integrated device according to the fifth embodiment changes the critical current densities of the domain wall movement layers 10 and 50 and the moving speed of the domain wall DW using a difference between the magnitudes of spin Hall angles of the wiring line layers 40 and 80. Thus, in the integrated device according to the fifth embodiment, the materials composing the domain wall movement layers 10 and 50 may be the same.

In addition, in the fifth embodiment, although an example in which the domain wall movement element 104 of the first element group and the domain wall movement element 114 of the second element group respectively have the wiring line layers 40 and 80 has been presented, a configuration in which the domain wall movement element 104 of the first element group does not have the wiring line layer 40, and the domain wall movement element 114 of the second element group has the wiring line layer 80 may be employed.

Sixth Embodiment

Figure 15:
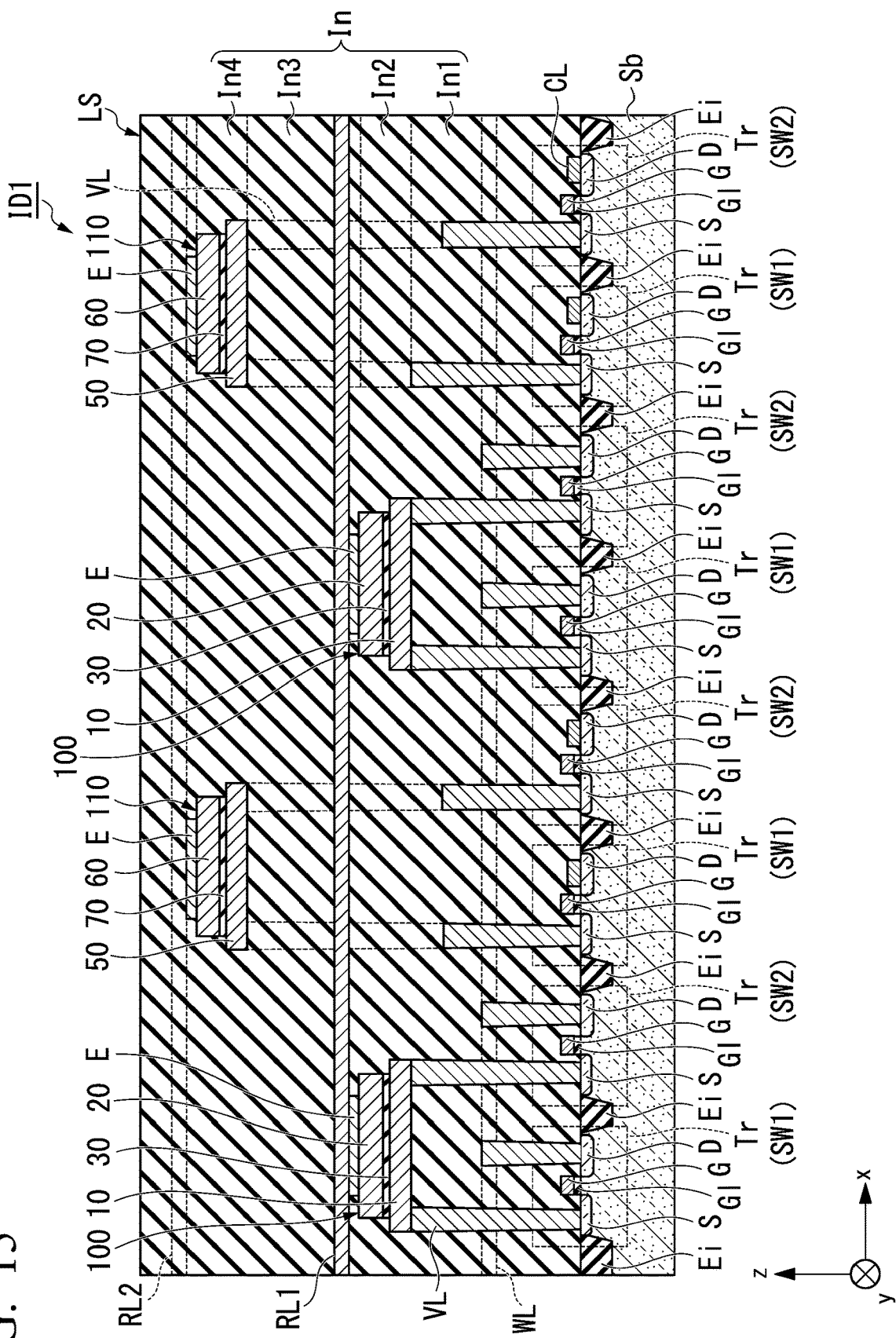
FIG. 15 is a cross-sectional view of a feature part of an integrated device according to a sixth embodiment.

FIG. 15 is a cross-sectional view of an integrated device ID1 according to a sixth embodiment. In FIG. 15, the arrangement of domain wall movement elements 100 and 110 is different from that according to the first embodiment (FIG. 4). In the sixth embodiment, the same reference signs will be assigned to the same components as those according to the first embodiment, and description thereof will be omitted.

In FIG. 15, all the domain wall movement elements 110 belonging to a second element group do not overlap the domain wall movement elements 100 belonging to a first element group when seen in the z direction. As more various structures are present in a layer lower than the domain wall movement elements 110, the flatness of a stacking surface at the time of manufacturing the domain wall movement elements 110 further decreases. This is because the number of processing steps to reach the stacking surface increases. By arranging the domain wall movement elements 110 at positions not overlapping the domain wall movement elements 100 when seen in the z direction, the flatness of the stacking surface at the time of manufacturing the domain wall movement elements 110 can be raised.

When the flatness of the stacking surface at the time of manufacturing the domain wall movement elements 110 is high, the flatness of a lower face of the domain wall movement layer 50 becomes high. By reducing the roughness of the domain wall movement layer 50, the possibility of movement of the domain wall DW in the x direction being trapped can decrease.

As described above, according to the integrated device ID1 of the sixth embodiment, effects similar to those of the integrated device ID according to the first embodiment are acquired. In addition, by decreasing a difference between degrees of roughness of the domain wall movement layer 10 and the domain wall movement layer 50, a difference between behaviors of the domain wall movement elements 100 of the first element group and the domain wall movement elements 110 of the second element group can be further inhibited.

Seventh Embodiment

Figure 16:
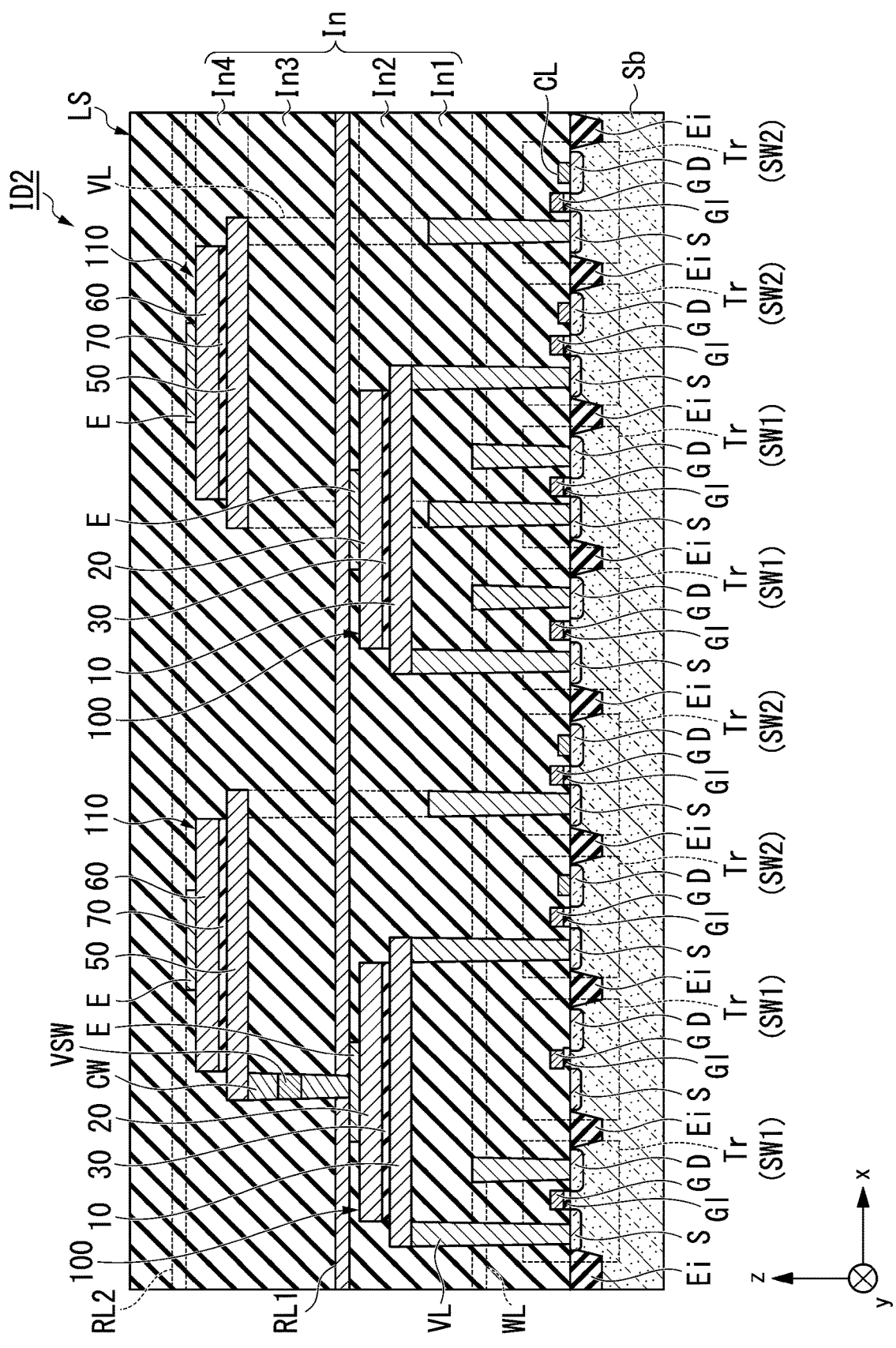
FIG. 16 is a cross-sectional view of a feature part of an integrated device according to a seventh embodiment.

FIG. 16 is a cross-sectional view of an integrated device ID2 according to a seventh embodiment. In FIG. 16, some of domain wall movement elements 100 and domain wall movement elements 110 are connected through a connection wiring line CW. In the seventh embodiment, the same reference signs will be assigned to the same components as those according to the first embodiment, and description thereof will be omitted.

For example, a domain wall movement element 100 is connected to the nearest domain wall movement element 110 through the connection wiring line CW without electrically passing through a substrate Sb. It is not necessary that all the domain wall movement elements 100 be connected to domain wall movement elements 110, and any one thereof may be connected to the domain wall movement element 110. For example, a ferromagnetic layer 20 of the domain wall movement element 100 is connected to a domain wall movement layer 50 of the domain wall movement element 110.

The connection wiring line CW may include a vertical switching element VSW. The vertical switching element VSW is a switching element composed of a laminated film stacked in the z direction. For example, an element using a phase change of a crystal layer such as an ovonic threshold switch (OTS), an element using a change of a band structure such as a metal insulator transition (MIT) switch, an element using a breakdown voltage such as a Zener diode or an avalanche diode, and an element of which conductivity changes in accordance with a change in an atomic position are vertical switching elements VSW.

When the domain wall movement element 100 and the domain wall movement element 110 are connected with the connection wiring line CW, a current path from a read line RL2 to a common line CL through the domain wall movement elements 100 and 110 is generated. In other words, combined resistance acquired by combining a resistance value of the domain wall movement element 100 and a resistance value of the domain wall movement element 110 can be read. In a neuromorphic device, the resistance values of the domain wall movement elements 100 and 110 correspond to weighting factors. The current path described above can express a new weighting factor acquired by combining the weighting factors of two domain wall movement elements 100 and 110. Thus, a neuromorphic device using the integrated device ID2 according to the seventh embodiment can express three weighting factors using the two domain wall movement elements 100 and 110 and can perform a more complex operation, whereby the power of expression increases. In this case, the first element group and the second element group are responsible for operations between two middle layers in a neural network NN.

Eighth Embodiment

Figure 17:
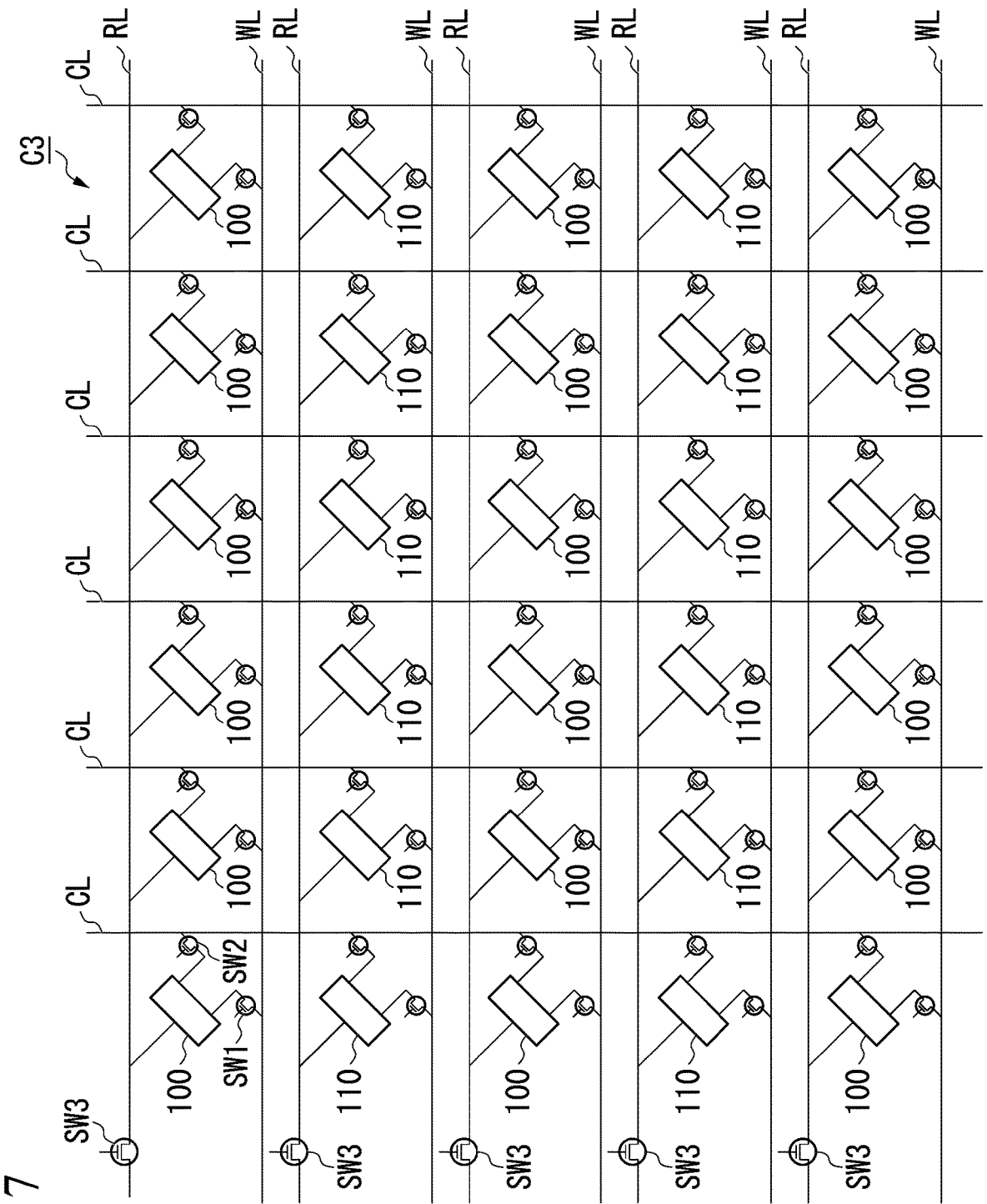
FIG. 17 is a circuit diagram of part of an integrated device according to an eighth embodiment.

FIG. 17 is a circuit diagram of part of an integrated device according to an eighth embodiment. In FIG. 17, domain wall movement elements 100 of a first element group and domain wall movement elements 110 of a second element group are arranged inside one product-sum operation circuit, which is different from the circuit diagram illustrated in FIG. 3. In the eighth embodiment, the same reference signs will be assigned to the same components as those according to the first embodiment, and description thereof will be omitted.

A third circuit C3 illustrated in FIG. 17 includes domain wall movement elements 100 of a first element group and domain wall movement elements 110 of a second element group. The third circuit C3 performs one product-sum operation. The third circuit C3 is responsible for a product-sum operation when another middle layer is reached from one middle layer. For example, the integrated device includes a plurality of third circuits C3. The integrated device performs a product-sum operation between layers of a neuromorphic device using each of the third circuits C3.

It is preferable that a proportion ratio between the domain wall movement elements 100 of the first element group and the domain wall movement elements 110 of the second element group in each third circuit C3 be the same. In accordance with this configuration, variations in the accuracy of the product-sum operation between layers can be decreased.

Up to here, an example of the integrated device and the neuromorphic device has been presented by presenting several embodiments. However, the present invention is not limited to the embodiments, and various changes can be made in a range in which the concept of the invention is not changed.

Figure 18:
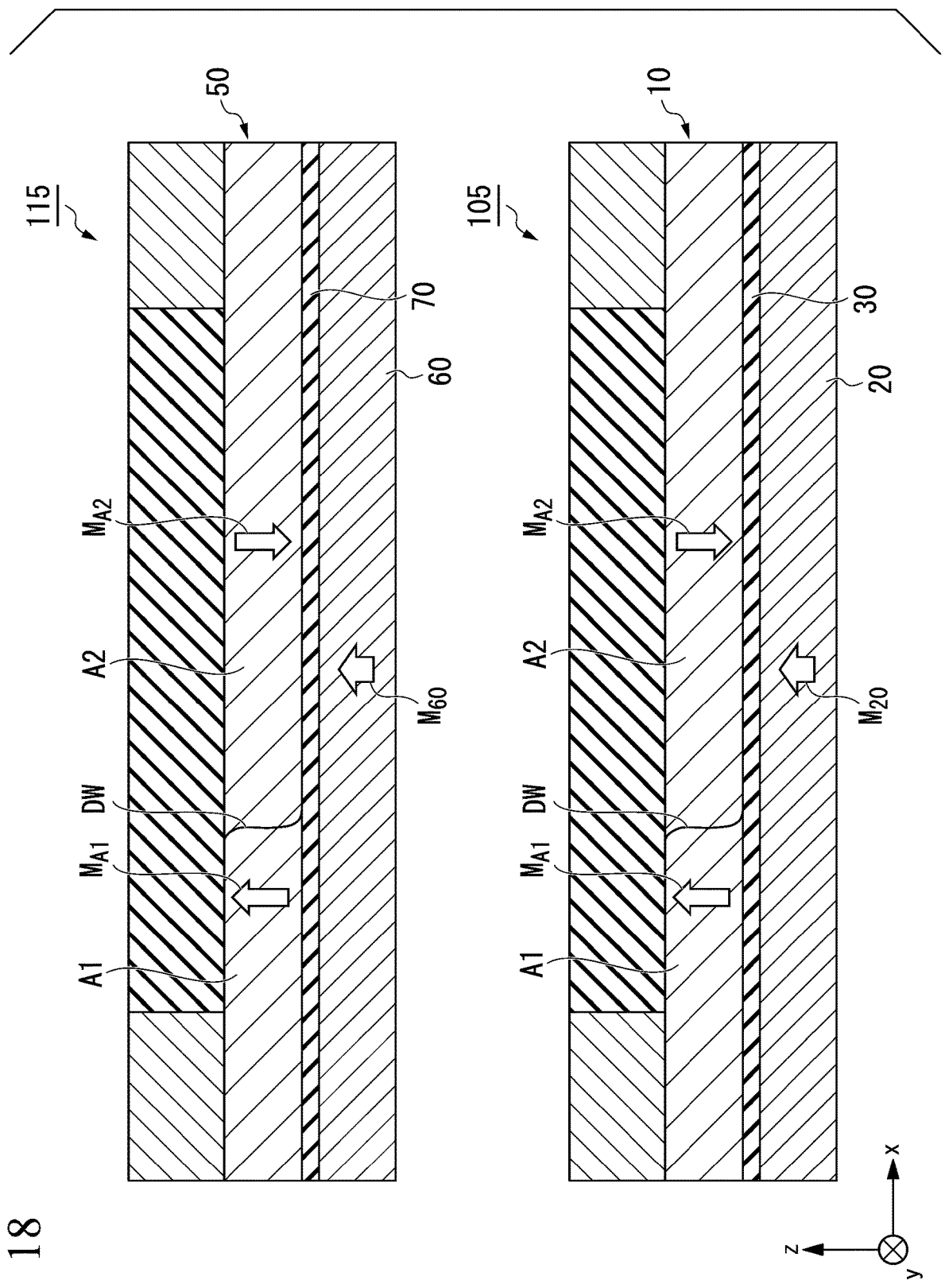
FIG. 18 is a cross-sectional view of a domain wall movement element of a first element group and a domain wall movement element of a second element group of an integrated device according to a modified example.

For example, FIG. 18 is a cross-sectional view of domain wall movement elements 105 of a first element group and domain wall movement elements 115 of a second element group of an integrated device according to a modified example. As illustrated in FIG. 18, the domain wall movement layers 10 and 50 may be disposed at positions farther from the substrate Sb than the ferromagnetic layers 20 and 60. FIG. 18 is called as a bottom pin structure in which ferromagnetic layers 20 and 60 having relatively high stability of magnetization are disposed on the substrate Sb side. The bottom pin structure illustrated in FIG. 18 has stability of magnetization higher than the top pin structure illustrated in FIG. 8.

Furthermore, featured configurations of the embodiments and the modified examples described above may be combined.

EXPLANATION OF REFERENCES 10, 50, 51, 52, 53 Domain wall movement layer
20, 60, 531, 532 Ferromagnetic layer
30, 70 Non-magnetic layer
40, 80 Wiring line layer
100, 104, 105, 110, 111, 112, 113, 114, 115 Domain wall movement element
533 Spacer layer
A1 First magnetic domain
A2 Second magnetic domain
C Chip
C1 First circuit
C2 Second circuit
C3 Third circuit
CL Common line
CW Connection wiring line
DW Domain wall
E Electrode
ID, ID1, ID2 Integrated device
In, In1, In2, In3, In4 Insulator
$L_{in}$ Input layer
$L_m$ Middle layer
$L_{out}$ Output layer
LS Laminated structure
NN Neural network
RL, RL1, RL2 Read line
VL Via wiring line
VSW Vertical switching element
θ1, θ2 Inclination angle

What is claimed is:

1. An integrated device comprising:
a substrate; and
a laminated structure stacked on the substrate,
wherein the laminated structure includes a first element group and a second element group disposed at a position farther from the substrate than the first element group,
wherein each of the first element group and the second element group includes a plurality of domain wall movement elements,
wherein each of the plurality of domain wall movement elements includes a domain wall movement layer, a ferromagnetic layer, and a non-magnetic layer interposed between the domain wall movement layer and the ferromagnetic layer, and
wherein each of the domain wall movement elements belonging to the second element group has a lower critical current density required for moving a domain wall of the domain wall movement layer than each of the domain wall movement elements belonging to the first element group.

2. The integrated device according to claim 1, wherein materials composing the domain wall movement layers of the domain wall movement element belonging to the first element group and the domain wall movement element belonging to the second element group are different from each other.

3. The integrated device according to claim 1, wherein widths of the domain wall movement layers of the domain wall movement element belonging to the first element group and the domain wall movement element belonging to the second element group are different from each other.

4. The integrated device according to claim 1, wherein a saturation magnetization of the domain wall movement layer of the domain wall movement element belonging to the second element group is lower than a saturation magnetization of the domain wall movement layer of the domain wall movement element belonging to the first element group.

5. The integrated device according to claim 1, wherein an electrical resistivity of the domain wall movement layer of the domain wall movement element belonging to the second element group is lower than an electrical resistivity of the domain wall movement layer of the domain wall movement element belonging to the first element group.

6. The integrated device according to claim 1, wherein a thickness of the domain wall movement layer of the domain wall movement element belonging to the second element group is smaller than a thickness of the domain wall movement layer of the domain wall movement element belonging to the first element group.

7. The integrated device according to claim 1, wherein each of the domain wall movement elements belonging to the second element group has a larger inclination angle of a side face of the domain wall movement layer with respect to a stacking direction in a cross-section orthogonal to a first direction in which the domain wall movement layer extends than each of the domain wall movement elements belonging to the first element group.

8. The integrated device according to claim 1, wherein the domain wall movement layer of the domain wall movement element belonging to the second element group includes a first layer and a second layer containing a ferromagnetic substance and a spacer layer interposed between the first layer and the second layer.

9. The integrated device according to claim 1, wherein the domain wall movement element belonging to the second element group further includes a wiring line layer that is disposed at a position at which the domain wall movement layer is interposed between the wiring line layer and the non-magnetic layer and applies a spin orbital torque to a magnetization of the domain wall movement layer.

10. The integrated device according to claim 9,
wherein the domain wall movement element belonging to the first element group further includes a wiring line layer that is disposed at a position in which the domain wall movement layer is interposed between the wiring line layer and the non-magnetic layer and applies a spin orbital torque to the magnetization of the domain wall movement layer, and
wherein the wiring line layer of the second element group has a larger spin Hall angle than the wiring line layer of the first element group.

11. The integrated device according to claim 1, wherein any one of the domain wall movement elements belonging to the second element group overlaps one of the domain wall movement elements belonging to the first element group when seen in a stacking direction.

12. The integrated device according to claim 1, wherein all the domain wall movement elements belonging to the second element group do not overlap the domain wall movement elements belonging to the first element group when seen in a stacking direction.

13. The integrated device according to claim 1, wherein the laminated structure further includes a connection wiring line connecting one domain wall movement element belonging to the first element group to one domain wall movement element belonging to the second element group.

14. The integrated device according to claim 1,
wherein the first element group performs a first product-sum operation, and the second element group performs a second product-sum operation, and
wherein a sum of outputs from a plurality of domain wall movement elements belonging to the first element group is input to the domain wall movement elements belonging to the second element group.

15. The integrated device according to claim 1, wherein a pulse length of a write pulse input to the domain wall movement element belonging to the second element group is longer than a pulse length of a write pulse input to the domain wall movement element belonging to the first element group.

16. The integrated device according to claim 1, wherein a pulse amplitude of a write pulse input to the domain wall movement element belonging to the second element group is larger than a pulse amplitude of a write pulse input to the domain wall movement element belonging to the first element group.

17. A neuromorphic device comprising the integrated device according to claim 1.

18. The neuromorphic device according to claim 17, further comprising a plurality of layers responsible for a neural network,
wherein the domain wall movement elements belonging to the first element group and the domain wall movement elements belonging to the second element group are responsible for operations between different layers.

19. The neuromorphic device according to claim 17, further comprising a plurality of layers responsible for a neural network,
wherein some of the domain wall movement elements belonging to the first element group and some of the domain wall movement elements belonging to the second element group are responsible for operations between the layers.

20. An integrated device comprising:
a substrate; and
a laminated structure stacked on the substrate,
wherein the laminated structure includes a first element group and a second element group disposed at a position farther from the substrate than the first element group,
wherein each of the first element group and the second element group includes a plurality of domain wall movement elements,
wherein each of the plurality of domain wall movement elements includes a domain wall movement layer, a ferromagnetic layer, and a non-magnetic layer interposed between the domain wall movement layer and the ferromagnetic layer, and
wherein each of the domain wall movement elements belonging to the second element group has a higher domain wall moving speed of the domain wall movement layer than each of the domain wall movement elements belonging to the first element group.

* * * * *